US009742371B2

(12) United States Patent
Ferrante et al.

(10) Patent No.: US 9,742,371 B2
(45) Date of Patent: *Aug. 22, 2017

(54) FAST AUTOMATIC GAIN CONTROL (AGC) FOR PACKET BASED SYSTEMS

(71) Applicant: INTERDIGITAL PATENT HOLDINGS, INC., Wilmington, DE (US)

(72) Inventors: Steven Ferrante, Doylestown, PA (US); Philip J. Pietraski, Jericho, NY (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/290,184

(22) Filed: Oct. 11, 2016

(65) Prior Publication Data
US 2017/0033751 A1  Feb. 2, 2017

Related U.S. Application Data

(63) Continuation of application No. 14/689,615, filed on Apr. 17, 2015, now Pat. No. 9,490,764.
(Continued)

(51) Int. Cl.
H03G 3/20 (2006.01)
H03G 3/30 (2006.01)
H04B 1/10 (2006.01)

(52) U.S. Cl.
CPC ............. H03G 3/20 (2013.01); H03G 3/3042 (2013.01); H03G 3/3078 (2013.01); H04B 1/1027 (2013.01)

(58) Field of Classification Search
CPC .. H03G 3/00; H03G 3/20; H03G 3/30; H03G 3/3052; H03G 3/3068; H03G 3/3094;
(Continued)

(56) References Cited

U.S. PATENT DOCUMENTS 4,608,559 A * 8/1986 Friedman ............ H04L 12/2801
370/462
6,567,489 B1 * 5/2003 Glover ............. G11B 20/10009
375/229

(Continued)

OTHER PUBLICATIONS

Ferrante et al., "Signal and Noise Power Maximum Likelihood Estimation for Fast AGC in Packet Based Systems," 11th International Symposium on Wireless Communications Systems (ISWCS), pp. 235-239 (Aug. 26-29, 2014).
(Continued)

Primary Examiner — Young T Tse
(74) Attorney, Agent, or Firm — Volpe and Koenig, P.C.

(57) ABSTRACT

A method and apparatus for use in a packet based wireless communication system for reducing automatic gain control (AGC) convergence time at a receiver are described. A radio frequency (RF) signal is received. The RF signal includes a sequence of a plurality of pre-defined power levels at a beginning of a preamble of the RF signal. Statistics for each of the plurality of pre-defined power levels at the beginning of the preamble of the RF signal are computed. An appropriate gain for a variable gain amplifier (VGA) is then computed based on the computed statistics for each of the plurality of pre-defined power levels and a-priori information related to transmission power differences between the plurality of pre-defined power levels of the sequence.

17 Claims, 23 Drawing Sheets

Related U.S. Application Data

(60) Provisional application No. 61/981,002, filed on Apr. 17, 2014.

(58) Field of Classification Search
CPC ...... H03G 3/3042; H03G 3/3078; H04B 1/06; H04B 1/1027; H04B 1/16
USPC ............... 375/316, 345; 370/310; 455/226.1, 455/232.1, 234.1, 234.2, 239.1, 240.1
See application file for complete search history.

(56) References Cited

U.S. PATENT DOCUMENTS

| | | |
|---|---|---|
| 7,787,841 B2 | 8/2010 | Tsukio et al. |
| 8,238,858 B2 | 8/2012 | Ando |
| 8,391,401 B2 | 3/2013 | Wang et al. |
| 8,660,221 B2 | 2/2014 | Chen et al. |
| 8,797,965 B2 | 8/2014 | Alriksson et al. |
| 9,025,706 B2 | 5/2015 | Kitamura |
| 2012/0274398 A1* | 11/2012 | Alavi ...................... H03F 3/189 330/1 R |
| 2013/0271307 A1* | 10/2013 | Kropfitsch ............. H03G 3/002 341/158 |
| 2014/0146926 A1* | 5/2014 | Kitamura .............. H04L 1/0036 375/345 |

OTHER PUBLICATIONS

IEEE P802.11ad-2012, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band, IEEE P802.11ad-2012 (Oct. 2012).

* cited by examiner

FAST AUTOMATIC GAIN CONTROL (AGC) FOR PACKET BASED SYSTEMS

CROSS REFERENCE TO RELATED APPLICATIONS

This application is a continuation of U.S. patent application Ser. No. 14/689,615, filed Apr. 17, 2015, now U.S. Pat. No. 9,490,764, which claims the benefit of U.S. Provisional Application No. 61/981,002, filed on Apr. 17, 2014, the contents of which are hereby incorporated by reference herein.

BACKGROUND

High data rate packet based systems, such as those of the Institute of Electrical and Electronics Engineers (IEEE) 802.11 family of standards (commonly known as WiFi), are becoming more widespread as the number of WiFi enabled devices being used continues to grow. Packet based communication generally operates under the assumption that the received signal is stationary over a packet time. Each received packet may consist of a training period followed by a data period. The a-priori known training period may be used for functions such as automatic gain control (AGC) and channel estimation, which may then be used for data detection in the data portion of the packet. Since the receiver does not typically have a-priori knowledge of the expected receive power, an AGC system is typically employed so that the incoming signal may be properly scaled before further processing.

AGC system performance generally depends on the ability to accurately estimate receive signal power. The initial gain setting may be set to a high level to ensure that low power signals are detected at the receiver. In a typical receiver configuration, a variable gain amplifier (VGA) may reside before an analog-to-digital converter (AIDC). Due to this configuration, there is a potential for heavy saturation at the output of the AIDC, where receive signal power estimation is normally performed. Heavy saturation may cause power to be underestimated when using estimators that do not account for clipping. This may lead to a slow AGC convergence time. Fast AGC convergence time is desirable in general, but is especially important for high rate packet based systems, because these systems allow for only a limited number of updates in the early stages of a training period of a received packet. This is due to the desire to fix the VGA gain relatively early in the preamble portion of the packet. Furthermore, optimal setting of the VGA gain requires statistics sufficient to estimate the received signal distribution. Various features of current AGC systems prevent fast AGC convergence, especially in high data-rate packet based systems. Thus, methods and apparatus to compute signal and noise measurements that take AIDC saturations into account are desired. In addition, methods and apparatus for appropriately setting the gain level at the VGA, quickly and accurately, are also desired.

SUMMARY

A method and apparatus for use in a packet based wireless communication system for reducing automatic gain control (AGC) convergence time at a receiver are described. A radio frequency (RF) signal is received. The RF signal includes a sequence of a plurality of pre-defined power levels at a beginning of a preamble of the RF signal. Statistics for each of the plurality of pre-defined power levels at the beginning of the preamble of the RF signal are computed. An appropriate gain for a variable gain amplifier (VGA) is then computed based on the computed statistics for each of the plurality of pre-defined power levels and a-priori information related to transmission power differences between the plurality of pre-defined power levels of the sequence.

Methods and apparatus for computing signal and noise measurements that take analog-to-digital converter saturations into account are also described. Methods and apparatus for computing signal and noise statistics separately and setting a VGA gain based on the separate signal and noise statistics are also described.

BRIEF DESCRIPTION OF THE DRAWINGS

A more detailed understanding may be had from the following description, given by way of example in conjunction with the accompanying drawings wherein.

DETAILED DESCRIPTION

Figure 1A:
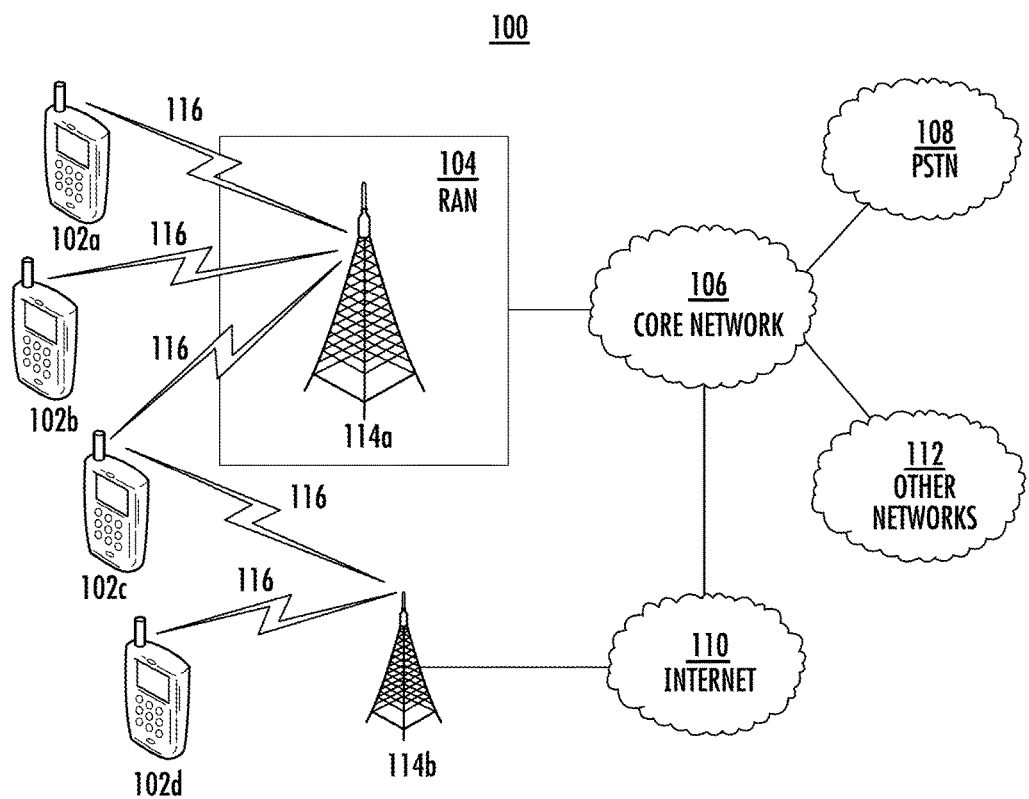
FIG. 1A is a system diagram of an example communications system in which one or more disclosed embodiments may be implemented.

FIG. 1A is a diagram of an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), and the like.

As shown in FIG. 1A, the communications system 100 may include wireless transmit/receive units (WTRUs) 102a, 102b, 102c, 102d, a radio access network (RAN) 104, a core network 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d may be configured to transmit and/or receive wireless signals and may include user equipment (UE), a mobile station, a fixed or mobile subscriber unit, a pager, a cellular telephone, a personal digital assistant (PDA), a smartphone, a laptop, a netbook, a personal computer, a wireless sensor, consumer electronics, and the like.

The communications systems 100 may also include a base station 114a and a base station 114b. Each of the base stations 114a, 114b may be any type of device configured to wirelessly interface with at least one of the WTRUs 102a, 102b, 102c, 102d to facilitate access to one or more communication networks, such as the core network 106, the Internet 110, and/or the other networks 112. By way of example, the base stations 114a, 114b may be a base transceiver station (BTS), a Node-B, an eNode B, a Home Node B, a Home eNode B, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, etc. The base station 114a and/or the base station 114b may be configured to transmit and/or receive wireless signals within a particular geographic region, which may be referred to as a cell (not shown). The cell may further be divided into cell sectors. For example, the cell associated with the base station 114a may be divided into three sectors. Thus, in one embodiment, the base station 114a may include three transceivers, i.e., one for each sector of the cell. In another embodiment, the base station 114a may employ multiple-input multiple-output (MIMO) technology and, therefore, may utilize multiple transceivers for each sector of the cell.

The base stations 114a, 114b may communicate with one or more of the WTRUs 102a, 102b, 102c, 102d over an air interface 116, which may be any suitable wireless communication link (e.g., radio frequency (RF), microwave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (VVCDMA). WCDMA may include communication protocols such as High-Speed Packet Access (HSPA) and/or Evolved HSPA (HSPA+). HSPA may include High-Speed Downlink Packet Access (HSDPA) and/or High-Speed Uplink Packet Access (HSUPA).

In another embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A).

In other embodiments, the base station 114a and the WTRUs 102a, 102b, 102c may implement radio technologies such as IEEE 802.16 (i.e., Worldwide Interoperability for Microwave Access (WiMAX)), CDMA2000, CDMA2000 1X, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, and the like. In one embodiment, the base station 114b and the WTRUs 102c, 102d may implement a radio technology such as IEEE 802.11 to establish a wireless local area network (WLAN). In another embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, etc.) to establish a picocell or femtocell. As shown in FIG. 1A, the base station 114b may have a direct connection to the Internet 110. Thus, the base station 114b may not be required to access the Internet 110 via the core network 106.

The RAN 104 may be in communication with the core network 106, which may be any type of network configured to provide voice, data, applications, and/or voice over internet protocol (VoIP) services to one or more of the WTRUs 102a, 102b, 102c, 102d. For example, the core network 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the core network 106 may be in direct or indirect communication with other RANs that employ the same RAT as the RAN 104 or a different RAT. For example, in addition to being connected to the RAN 104, which may be utilizing an E-UTRA radio technology, the core network 106 may also be in communication with another RAN (not shown) employing a GSM radio technology.

The core network 106 may also serve as a gateway for the WTRUs 102a, 102b, 102c, 102d to access the PSTN 108, the Internet 110, and/or other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and the internet protocol (IP) in the TCP/IP internet protocol suite. The networks 112 may include wired or wireless communications networks owned and/or operated by other service providers. For example, the networks 112 may include another core network connected to one or more RANs, which may employ the same RAT as the RAN 104 or a different RAT.

Some or all of the WTRUs 102a, 102b, 102c, 102d in the communications system 100 may include multi-mode capabilities, i.e., the WTRUs 102a, 102b, 102c, 102d may include multiple transceivers for communicating with different wireless networks over different wireless links. For example, the WTRU 102c shown in FIG. 1A may be configured to communicate with the base station 114a, which may employ a cellular-based radio technology, and with the base station 114b, which may employ an IEEE 802 radio technology.

Figure 1B:
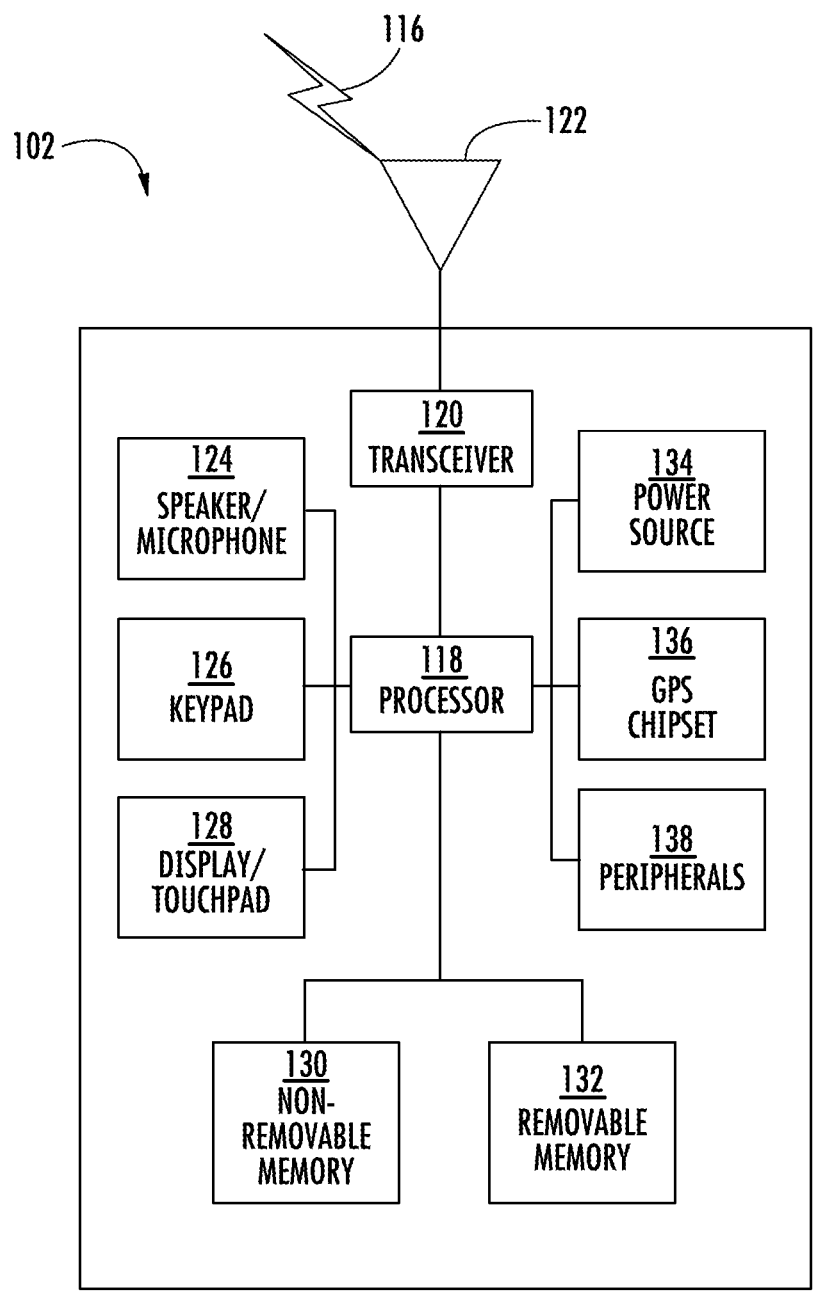
FIG. 1B is a system diagram of an example wireless transmit/receive unit (WTRU) that may be used within the communications system illustrated in FIG. 1A.

FIG. 1B is a system diagram of an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and other peripherals 138. It will be appreciated that the WTRU 102 may include any subcombination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In another embodiment, the transmit/receive element 122 may be an emitter/detector configured to transmit and/or receive IR, UV, or visible light signals, for example. In yet another embodiment, the transmit/receive element 122 may be configured to transmit and receive both RF and light signals. It will be appreciated that the transmit/receive element 122 may be configured to transmit and/or receive any combination of wireless signals.

In addition, although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as UTRA and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs or video), a universal serial bus (USB) port, a vibration device, a television transceiver, a hands free headset, a Bluetooth® module, a frequency modulated (FM) radio unit, a digital music player, a media player, a video game player module, an Internet browser, and the like.

Figure 1C:
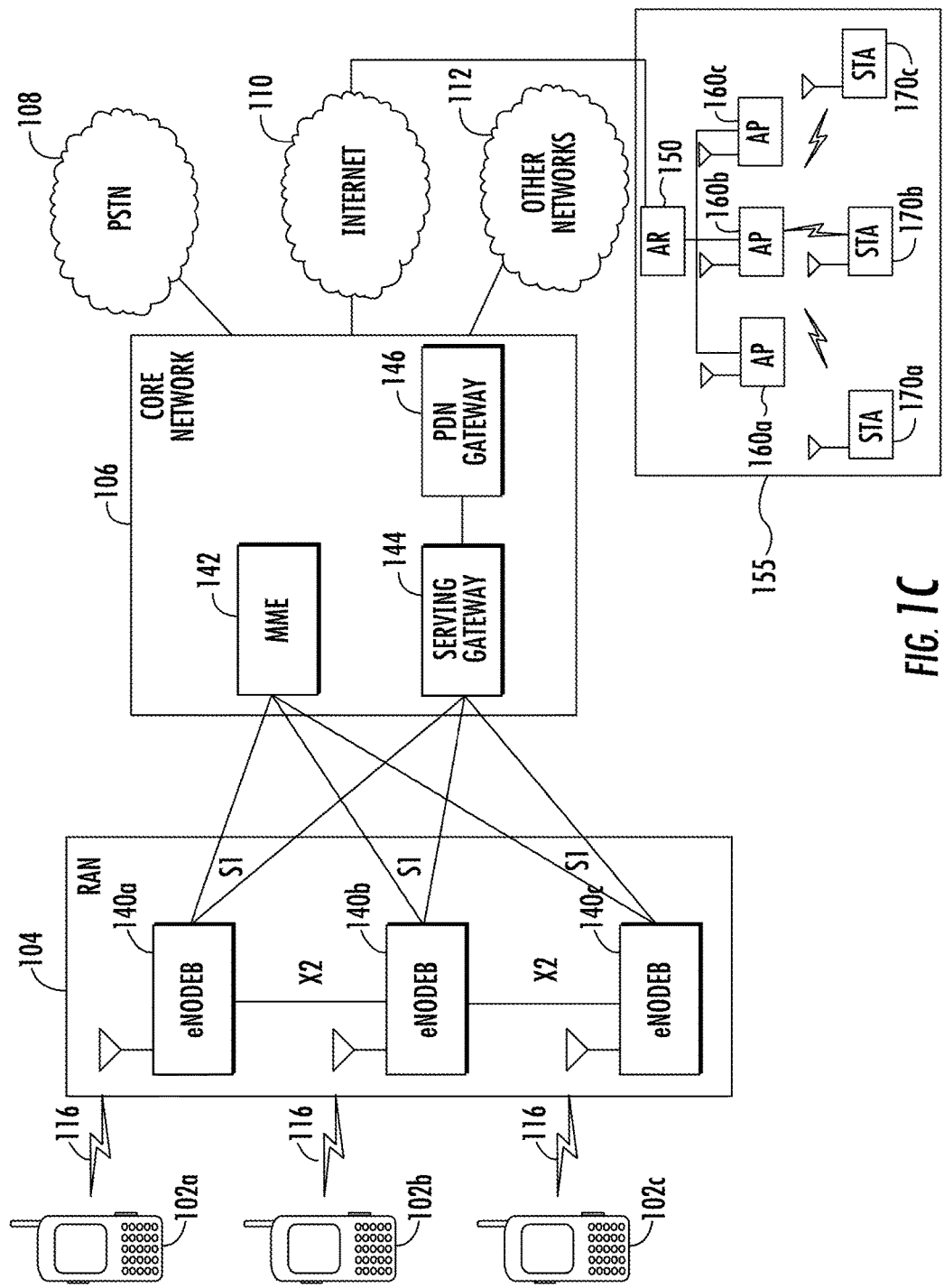
FIG. 1C is a system diagram of an example radio access network and an example core network that may be used within the communications system illustrated in FIG. 1A.

FIG. 1C is a system diagram of the RAN 104 and the core network 106 according to an embodiment. As noted above, the RAN 104 may employ an E-UTRA radio technology to communicate with the WTRUs 102a, 102b, 102c over the air interface 116. The RAN 104 may also be in communication with the core network 106.

The RAN 104 may include eNode-Bs 140a, 140b, 140c, though it will be appreciated that the RAN 104 may include any number of eNode-Bs while remaining consistent with an embodiment. The eNode-Bs 140a, 140b, 140c may each include one or more transceivers for communicating with the WTRUs 102a, 102b, 102c over the air interface 116. In one embodiment, the eNode-Bs 140a, 140b, 140c may implement MIMO technology. Thus, the eNode-B 140a, for example, may use multiple antennas to transmit wireless signals to, and receive wireless signals from, the WTRU 102a.

Each of the eNode-Bs 140a, 140b, 140c may be associated with a particular cell (not shown) and may be configured to handle radio resource management decisions, handover decisions, scheduling of users in the uplink and/or downlink, and the like. As shown in FIG. 1C, the eNode-Bs 140a, 140b, 140c may communicate with one another over an X2 interface.

The core network 106 shown in FIG. 1C may include a mobility management gateway (MME) 142, a serving gateway 144, and a packet data network (PDN) gateway 146. While each of the foregoing elements are depicted as part of the core network 106, it will be appreciated that any one of these elements may be owned and/or operated by an entity other than the core network operator.

The MME 142 may be connected to each of the eNode-Bs 142a, 142b, 142c in the RAN 104 via an S1 interface and may serve as a control node. For example, the MME 142 may be responsible for authenticating users of the WTRUs 102a, 102b, 102c, bearer activation/deactivation, selecting a particular serving gateway during an initial attach of the WTRUs 102a, 102b, 102c, and the like. The MME 142 may also provide a control plane function for switching between the RAN 104 and other RANs (not shown) that employ other radio technologies, such as GSM or WCDMA.

The serving gateway 144 may be connected to each of the eNode Bs 140a, 140b, 140c in the RAN 104 via the S1 interface. The serving gateway 144 may generally route and forward user data packets to/from the WTRUs 102a, 102b, 102c. The serving gateway 144 may also perform other functions, such as anchoring user planes during inter-eNode B handovers, triggering paging when downlink data is available for the WTRUs 102a, 102b, 102c, managing and storing contexts of the WTRUs 102a, 102b, 102c, and the like.

The serving gateway 144 may also be connected to the PDN gateway 146, which may provide the WTRUs 102a, 102b, 102c with access to packet-switched networks, such as the Internet 110, to facilitate communications between the WTRUs 102a, 102b, 102c and IP-enabled devices. An access router (AR) 150 of a wireless local area network (WLAN) 155 may be in communication with the Internet 110. The AR 150 may facilitate communications between APs 160a, 160b, and 160c. The APs 160a, 160b, and 160c may be in communication with STAs 170a, 170b, and 170c.

The core network 106 may facilitate communications with other networks. For example, the core network 106 may provide the WTRUs 102a, 102b, 102c with access to circuit-switched networks, such as the PSTN 108, to facilitate communications between the WTRUs 102a, 102b, 102c and traditional land-line communications devices. For example, the core network 106 may include, or may communicate with, an IP gateway (e.g., an IP multimedia subsystem (IMS) server) that serves as an interface between the core network 106 and the PSTN 108. In addition, the core network 106 may provide the WTRUs 102a, 102b, 102c with access to the networks 112, which may include other wired or wireless networks that are owned and/or operated by other service providers.

The following methods and apparatus may be employed in various communications systems, such as any one of the communications systems described above. In addition, the methods and apparatus described herein are not limited to high data packet based systems, such as those of the IEEE 802.11 family of standards. It should also be noted that any reference to the IEEE 802.11ad standard is for explanation purposes only and is not intended to be limiting.

Fast automatic gain control (AGC) convergence is highly desirable for high data rate systems. In particular, for packet based systems, it is desirable to obtain AGC convergence early in the preamble part of each packet so that less of the preamble may be dedicated to AGC, which results in less overhead. An AGC algorithm may be used to properly scale the incoming signal so that the full dynamic range of the analog-to-digital converter (ADC) is utilized, while at the same time minimizing the probability of clipping. Signal scaling may be performed in the analog domain, through a single variable gain amplifier (VGA). Alternatively, signal scaling may be performed through multiple VGAs, for example at each VGA per radio frequency (RF) chain in a receiver with multiple RF chains.

AGC convergence time may depend on the accuracy of estimates of input signal properties via measurements that are made in the digital domain after the ADC. Making accurate measurements of the analog domain signal in the digital domain may be challenging when the incoming signal is such that the ADC is saturated, and therefore some information may be lost. At the same time, in order to meet receiver sensitivity requirements, VGA gain may be initially set high, which may consequently cause heavy saturation when the incoming signal power is significantly higher than the minimum required receive signal power.

Figure 2:
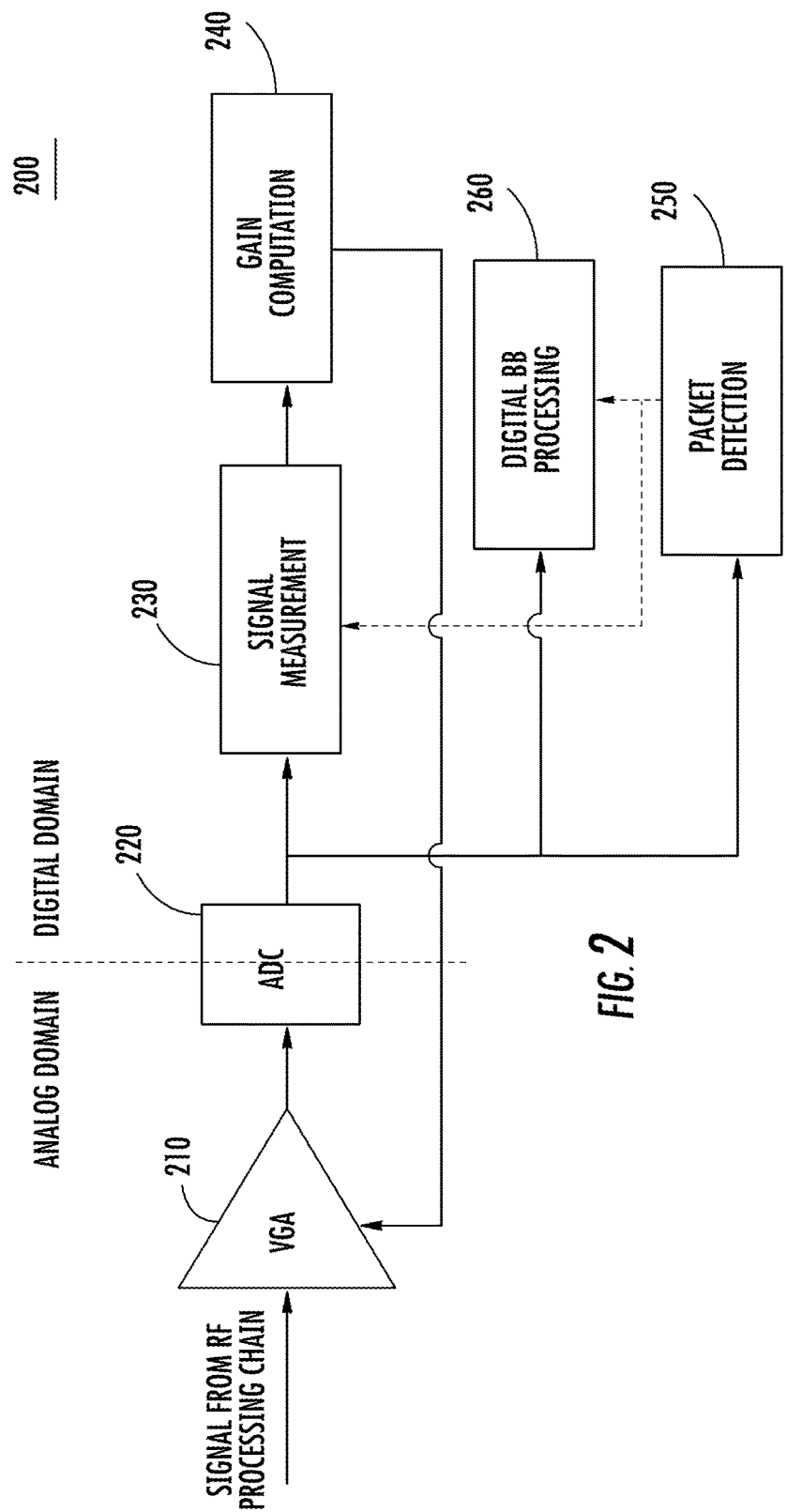
FIG. 2 is a diagram of a simplified automatic gain control (AGC) system.

FIG. 2 is a diagram of a simplified AGC system 200. The simplified AGC system 200 consists of a variable gain amplifier (VGA) 210, an analog-to-digital converter (ADC) 220, a signal measurement block 230, a gain computation block 240, a packet detection block 250, and a digital baseband (BB) processing block 260. Power estimation is typically performed in the digital domain after the ADC 220. The AGC system 200 generates a feedback signal that controls the VGA 210 in the analog domain in an attempt to properly scale the incoming signal.

Referring to FIG. 2, the simplified AGC system 200 will now be described in more detail. The VGA 210 is configured to scale an incoming analog signal from the radio front-end (RF) processing chain (not shown) based on feedback from the gain computation block 240 in the digital domain. As discussed above, the VGA 210 may initially be set to a high gain prior to the arrival of a packet. The ADC 220 converts a received analog signal to a digital signal. Signal values outside of the dynamic range of the ADC 220, (i.e., +C, −C), may be clipped to these maximum and minimum values. The signal measurement block 230 estimates a statistic of the signal that may ultimately be used by the VGA gain computation block 240. Examples of some possible statistics that may be used are: signal power, signal amplitude, signal root mean square (RMS) value, and peak-to-peak signal amplitude. Other signal statistics known to one of skill in the art may also be used. Based on the estimated signal statistic and other desired signal criteria, the gain computation block 240 may compute an appropriate gain value that may be used to control the VGA 210. The gain computation block 240 may feed this computed gain value back to the VGA 210. When the packet detection block 250 detects the start of a packet (SoP), the packet detection block 250 sends a control signal to start the signal measurement block 230 and timing control signals to the baseband processing block 260 of the simplified AGC system 200 to begin processing the data portion of the signal.

As discussed above, the VGA 210 may initially be set to a high gain prior to the arrival of a packet in order to meet receive sensitivity specifications. This initial high gain may be appropriate for the weakest signal expected to be received plus thermal noise. However, this initial high gain may not be appropriate for all signal strengths. Depending on the actual received signal power, which may be much larger than the weakest signal expected to be received plus thermal noise, there may be heavy saturation at the output of the ADC 220 (i.e., when the incoming signal power is significantly higher than the sensitivity specification). Traditional signal measurement techniques treat all signal samples from the ADC 220 equally when computing one of the various signal statistics. In this sense, samples that are saturated at the AIDC 220 are treated as if the saturated values represent the actual analog signal values at the particular sample times. In reality, these values may be grossly underestimated. Underestimating the signal statistics may lead to inadequate gain adjustments at the VGA 210, which in turn will slow AGC convergence time, as many additional iterations may be required in order to determine an appropriate gain. In addition, the inability to converge appropriately in the limited allotted time, will affect the performance of the downstream processing which often leads to lower data rates and/or loss of the signal. Thus, new measurement methods and techniques are desired that take ADC saturations into account and improve AGC convergence times.

In addition, as discussed above, traditional AGC systems typically rely on a single statistic in order to compute an appropriate VGA gain setting. For example, although a typical receiver input signal contains both a desired signal component and an undesired noise/interference component, a traditional signal power estimate would provide only the total signal power. The statistical nature of the signal is not well described by the use of only one statistic. As a result, the ability to compute a suitable VGA gain update is limited when using only one statistic to describe the input signal. Thus, it is desirable to allow the VGA computation to be a function of more than one statistic so that more accurate gain values are computed and AGC convergence times may be improved.

Methods for enhanced signal measurement and gain computation will now be described. As discussed above, traditional AGC systems do not take ADC saturation into account when computing a signal statistic, causing gross underestimates when the input signal is highly saturated. This leads to slower AGC convergence times. To combat this, the saturated samples should be treated differently than non-saturated samples.

In a first embodiment, the AGC system may retain knowledge of the number of samples that are saturated and the number of samples that are not. C may be used to denote the absolute value of maximum and minimum ADC output values, i.e., the ADC saturation point threshold. To be conservative, it is desirable to set the ADC saturation point threshold lower than the absolute saturation point of the ADC. The lower threshold value may be defined as T. Therefore, although the ADC saturated values are +/−C, the AGC system may treat all sampled valued above T as saturated, where T≤C. More generally, each sample (or each pair of in-phase and quadrature (I-Q) samples) may be categorized into different classes or "bins" based on a function of their value(s), for example, by subdividing the range of such a function into B "bins," or by maintaining a count of the number of samples that fall into each "bin," e.g., the number of samples that fall into a saturated "bin" and a number of samples that fall into a non-saturated "bin."

This retained information about the saturated samples may be utilized in various ways. For example, in a first embodiment, statistical estimation may be employed. The saturated input signal may be statistically described to derive an appropriate signal measurement estimator. This may be done using a Maximum Likelihood Estimation (MLE) technique, which will be described in more detail below. In a second embodiment, two separate statistics may be generated and used in conjunction with a look-up table (LUT) to estimate signal power and noise power, taking ADC saturations into consideration. In a third embodiment, a per-saturated sample adjustment method may be employed. Each embodiment will be described in more detail below using equations that employ the following variables:

$x_R$: The Real part of the respective estimator input signal;

$x_I$: The Imaginary part of the respective estimator input signal;

$\sigma^2$: Noise Power;

C: Absloute value of maximum and minimum ADC output value;

N: Number of samples used for each estimate;

$N_{NS}$: Number of non saturated samples;

$N_S$: Number of saturated samples;

$N_{LS}$: Number of negatively saturated samples;

$N_{HS}$: Number of positively saturated samples, $N_S = N_{LS} + N_{HS}$;

$S_R$: Real part of the input signal vector, $S_R = AG\cos(\phi)$;

$S_I$: Inaginary part of the input signal vector, $S_I = AG\sin(\phi)$; and

G: Current VGA Gain Value.

The first embodiment, statistical estimation using signal and noise power MLE to statistically describe the saturated input signal to derive an appropriate signal estimator will now be described. It should be noted that while various MLE based estimators will be described, other options and implementations are possible and not excluded. In addition, the estimators described herein assume certain input signals. For example, the noise power estimator input signal model assumes Gaussian noise only with a mean of zero and a variance after the VGA of $\sigma^2$ and the conditional probability distribution function (PDF) of the resulting signal output from the ADC contains one zero mean Gaussian PDF that is saturated at +C, −C. The signal power estimator one input signal model assumes the binary phase shift keying (BPSK) modulated preamble is transmitted through a static channel with an impulse response given by: $h(n) = Ae^{-j\phi}\delta(n)$, that this is added to the Gaussian noise signal at the receiver, and that the conditional PDF of the resulting signal output from the AIDC consists of two shifted Gaussian PDFs that are saturated at +C, −C. The signal power estimator two input signal model also assumes the BPSK modulated preamble is transmitted through a static channel with an impulse response given by: $h(n)=Ae^{-i\phi}\delta(n)$, that this is added to the Gaussian noise signal at the receiver, and that since timing information is now available, the preamble is removed so that the conditional PDF of the resulting signal output from the ADC consists of one shifted Gaussian PDF that is saturated at +C, −C.

As discussed above, the packet detection circuit is continuously searching for the SoP. To make most efficient use of the training period, signal power may be measured concurrently while searching for a packet so that the first AGC update can occur as soon as a packet is detected. This may require the first power estimate to be made in the absence of any timing information that would come from packet detection. The signal may also suffer from distortions from the propagation channel, sampling time offset (STO), and carrier frequency offset (CFO), and the like. The signal model used for the MLE technique described herein may account for an unknown channel gain and phase, assumed to be fixed for the packet duration; however, the other impairments may be assumed to be negligible. The training period may be designed robustly to aid in overall detection reliability, and as such, binary phase shift keying (BPSK) modulation may be assumed in the analysis. This may also be consistent with IEEE 802.11ad once the complex exponential is removed in the receiver. With this in mind, the ADC sampled signal before clipping and quantization may be described as follows:

$$\tilde{x}(n) = G\{d(n)Ae^{j\theta} + \tilde{w}(n)\}$$
$$= d(n)\{M\cos\theta + jM\sin\theta\} + w(n)$$
$$= d(n)\{S_R + jS_I\} + w(n)$$

Equation (1)

Where d(n) is an independent, identically distributed (IID) process taking values of +1 and −1 representing the BPSK data, G is the VGA gain, and $Ae^{j\theta}$ is the complex channel gain. Furthermore, letting M=GA, M and θ may be identified as the unknown parameters. Finally, it may be noted that w~CN $(0, 2\sigma^2)$ may be the noise signal after the VGA has been applied, and assuming IID real and imaginary noise components, the overall complex signal components may be treated separately in the analysis. $S_R$ and $S_I$ may be estimated first. After estimating these component values, M may be found by summing the squares of each. Focusing on the clipping and ignoring the quantization effects of the ADC, the final signal may be expressed as:

$$x_{R,I}(n) = \begin{cases} S_{R,I}(n) + w_{R,I}(n), & |\tilde{x}_{R,I}(n)| < C \\ C\,\text{sign}(\tilde{x}_{R,I}(n)), & \text{otherwise} \end{cases}$$

Equation (2)

$$\text{sign}(x) = \begin{cases} +1, & x \geq 0 \\ -1, & x < 0 \end{cases}$$

where C is the ADC saturation point, assumed to be known.

Figure 3:
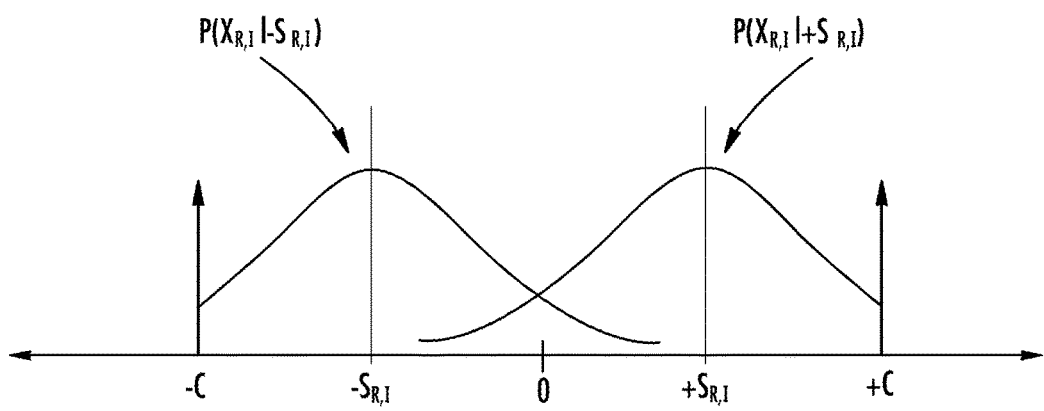
FIG. 3 is a graphical representation of a signal model probability distribution function (pdf)

Signal power estimation will now be described. The signal model provided in Equation (2) may be described by a mixture of Gaussian pdfs with identical variances of $\sigma^2$, and mean values of $-S_{R,I}$ and $+S_{R,I}$ respectively. In addition, to account for the saturations, the PDF may contain delta functions at the ADC saturation values, +C and −C. FIG. 3 is a graphical representation of this signal model pdf, which may be written for each component as follows:

$$p(x_{R,I}(n) \mid S_{R,I}) = \begin{cases} \left(\frac{1}{8\pi\sigma^2}\right)^{\frac{1}{2}}\left(e^{-\left[\frac{(x_{R,I}(n)+S_{R,I})^2}{2\sigma^2}\right]} + e^{-\left[\frac{(x_{R,I}(n)-S_{R,I})^2}{2\sigma^2}\right]}\right), & |x_{R,I}(n)| < C \\ \frac{1}{4}\left(\text{erfc}\left(\frac{C+S_{R,I}}{\sqrt{2}\,\sigma}\right) + \text{erfc}\left(\frac{C-S_{R,I}}{\sqrt{2}\,\sigma}\right)\right), & |x_{R,I}(n)| = C \\ 0, & \text{otherwise} \end{cases}$$

Equation (3)

The maximum likelihood estimation of $S_{R,I}$ may be found by maximizing the joint PDF over multiple samples, which may be referred to as the likelihood function, $L(x_{R,I}(n)|S_{R,I})$, and is formally written as follows:

$$\hat{S}_{R,I} = \text{argmax}_{S_{R,I}}(L(x_{R,I}(n)|S_{R,I})).$$

Equation (4)

The maximization in Equation (4) may be performed based on N observations of the input signal, $x_{R,I}(n)$. Of these N observations, $N_{LS}$ may be negatively saturated, $N_{HS}$ may be positively saturated, and $N_{NS}$ may not be saturated. Note since the PDF is symmetrical, as shown in FIG. 3, $N_{LS}$ and $N_{HS}$ may be combined in Equation (5) and expressed with $N_S$ only, where $N_S = N_{LS} + N_{HS}$. It may be assumed that the N observations are statistically independent so that the joint PDF is the product of N appropriate pdfs. Furthermore, the log likelihood function may be used so that the product of the pdfs may be written as the sum of logarithm of the pdfs. The log likelihood function may now be expressed as follows:

$$\ln \mathcal{L}(x_{R,I}(n) \mid S_{R,I}) = \left[\frac{-N_{NS}\ln(8\pi\sigma^2)}{2}\right] +$$

$$\left[\sum_{n=0}^{N_{NS}-1} \ln\left(e^{-\left[\frac{(x_{R,I}(n)+S_{R,I})^2}{2\sigma^2}\right]} + e^{-\left[\frac{(x_{R,I}(n)-S_{R,I})^2}{2\sigma^2}\right]}\right)\right] +$$

$$[-N_S \ln(4)] + \left[N_S\left(\text{erfc}\left(\frac{C-S_{R,I}}{\sqrt{2}\,\sigma}\right) + \text{erfc}\left(\frac{C+S_{R,I}}{\sqrt{2}\,\sigma}\right)\right)\right]$$

Equation (5)

Maximizing this log likelihood function may be accomplished by differentiating with respect to $S_{R,I}$ and setting the result to zero. Performing this procedure results in the following equation, that may be satisfied to find the estimate, $\hat{S}_{R,I}$:

$$\left[\frac{1}{N_{NS}}\sum_{n=0}^{N_{NS}-1}\left(x_{R,I}(n)\tanh\left(\frac{S_{R,I}x_{R,I}(n)}{\sigma^2}\right)\right)\right] -$$

$$S_{R,I} + \left[\left(\frac{N_S}{N_{NS}}\sigma\sqrt{\frac{2}{\pi}}\right)\right]$$

Equation (6)

$$\left[\frac{e^{-\left[\frac{(C-S_{R,I})^2}{2\sigma^2}\right]} - e^{-\left[\frac{(C+S_{R,I})^2}{2\sigma^2}\right]}}{\text{erfc}\left(\frac{C-S_{R,I}}{\sqrt{2}\sigma}\right) + \text{erfc}\left(\frac{C+S_{R,I}}{\sqrt{2}\sigma}\right)}\right] = 0$$

This equation is transcendental so that $\hat{S}_{R,I}$ may not be isolated to show an explicit algebraic relationship for $\hat{S}_{R,I}$ that depends solely on the remaining parameters. Equation (6) may be rewritten as:

$$\left[\frac{1}{N_{NS}}\sum_{n=0}^{N_{NS}-1}\left(x_{R,I}(n)\tanh\left(\frac{S_{R,I}x_{R,I}(n)}{\sigma^2}\right)\right)\right] = \quad \text{Equation (7)}$$

$$S_{R,I} - \left[\left(\frac{N_S}{N_{NS}}\sigma\sqrt{\frac{2}{\pi}}\right)\left(\frac{e^{-\left[\frac{(C-S_{R,I})^2}{2\sigma^2}\right]} - e^{-\left[\frac{(C+S_{R,I})^2}{2\sigma^2}\right]}}{\text{erfc}\left(\frac{C-S_{R,I}}{\sqrt{2}\sigma}\right) + \text{erfc}\left(\frac{C+S_{R,I}}{\sqrt{2}\sigma}\right)}\right)\right]$$

$$\frac{1}{N_{NS}}\sum_{n=0}^{N_{NS}-1}F_1(x_{R,I}(n), S_{R,I}, \sigma) = F_2\left(\frac{N_S}{N_{NS}}, S_{R,I}, \sigma\right)$$

Figure 4:
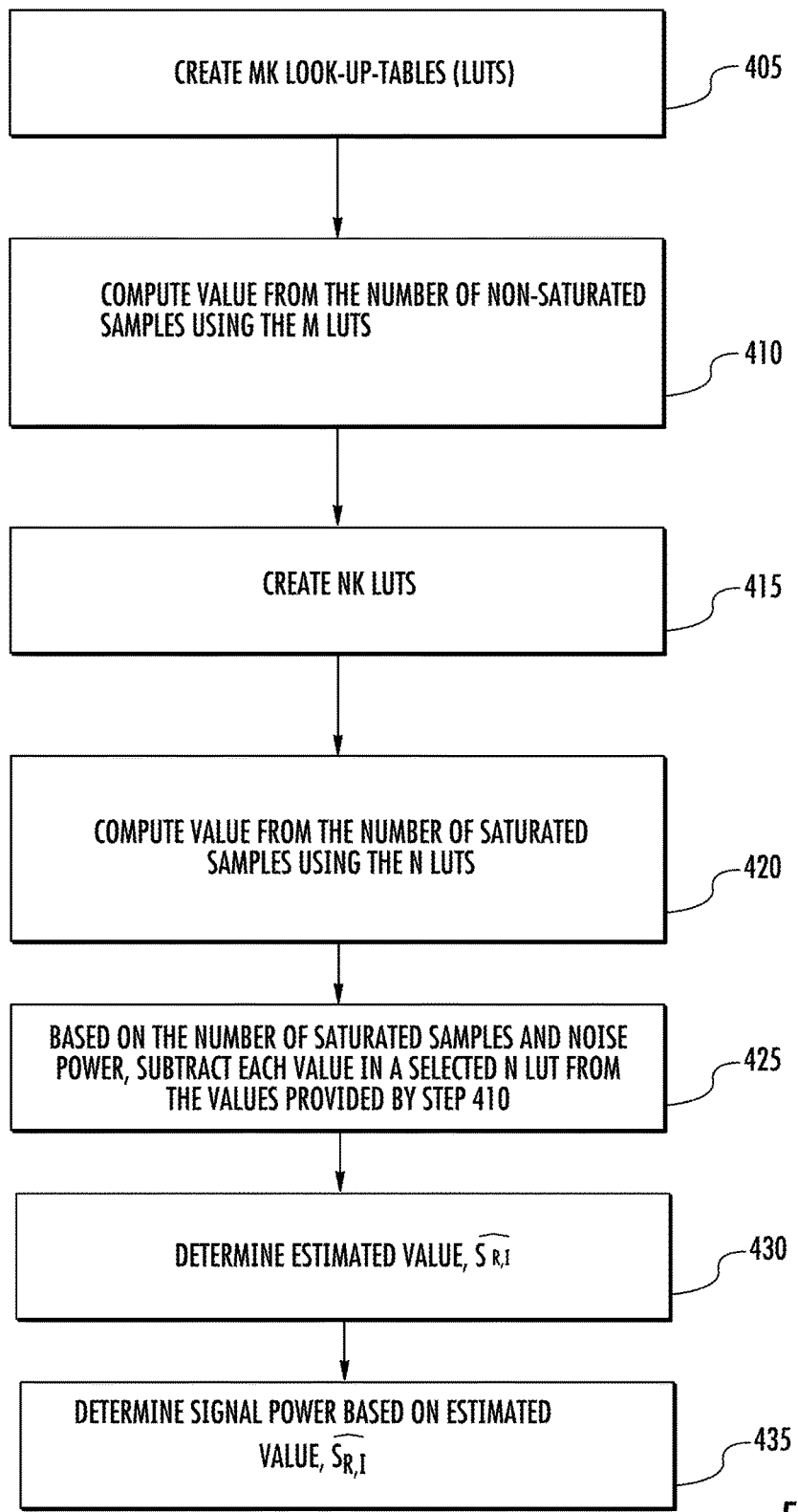
FIG. 4 is a flow diagram of a look-up table (LUT)-based signal power maximum likelihood estimation (MLE) method before timing.

FIG. 4 is a flow diagram of a LUT-based signal power ML estimation method, before timing, in accordance with Equation (7). Referring to FIG. 4, at step 405, MK LUTs are created, where M and K represent the granularity used for $S_{R,I}$ and $\sigma^2$ respectively. Each LUT represents the function, $F_1(x_{R,I}(n), S_{R,I}, \sigma)$ for a particular value of $S_{R,I}$ and $\sigma^2$. At step 410, a value, the left hand side (LHS) of Equation (7), $$LHS(m) = \frac{1}{N_{NS}}\sum_{n=0}^{N_{NS}-1}F_1(x_{R,I}(n), S_{R,I}, \sigma),$$

is computed from the $N_{NS}$ incoming samples, using the M LUTs that correspond to the current value of the noise power, $\widehat{\sigma^2}$. At step 415, NK LUTs are created, where K represents the granularity used for $\sigma^2$. Each LUT represents the inverse of $F_2(N_S, S_{R,I}, \sigma)$ for a particular value of $N_S$ and $\sigma^2$. At step 420, a value, the left hand side (RHS) of Equation (7), $$RHS = F_2\left(\frac{N_S}{N_{NS}}, S_{R,I}, \sigma\right),$$

is computed. At step 425, based on the current value of $N_S$ and $\sigma^2$, each value in the selected LUT is subtracted from the values provided by LHS(m). At step 430, the estimated value, $\widehat{S_{R,I}}$ is determined based on the index whose subtracted value is minimum. At step 435, the signal power may then be computed as $$\widehat{AG^2} = (\widehat{S_R})^2 + (\hat{S}_I)^2. \quad \text{Equation (8)}$$

Figure 5:
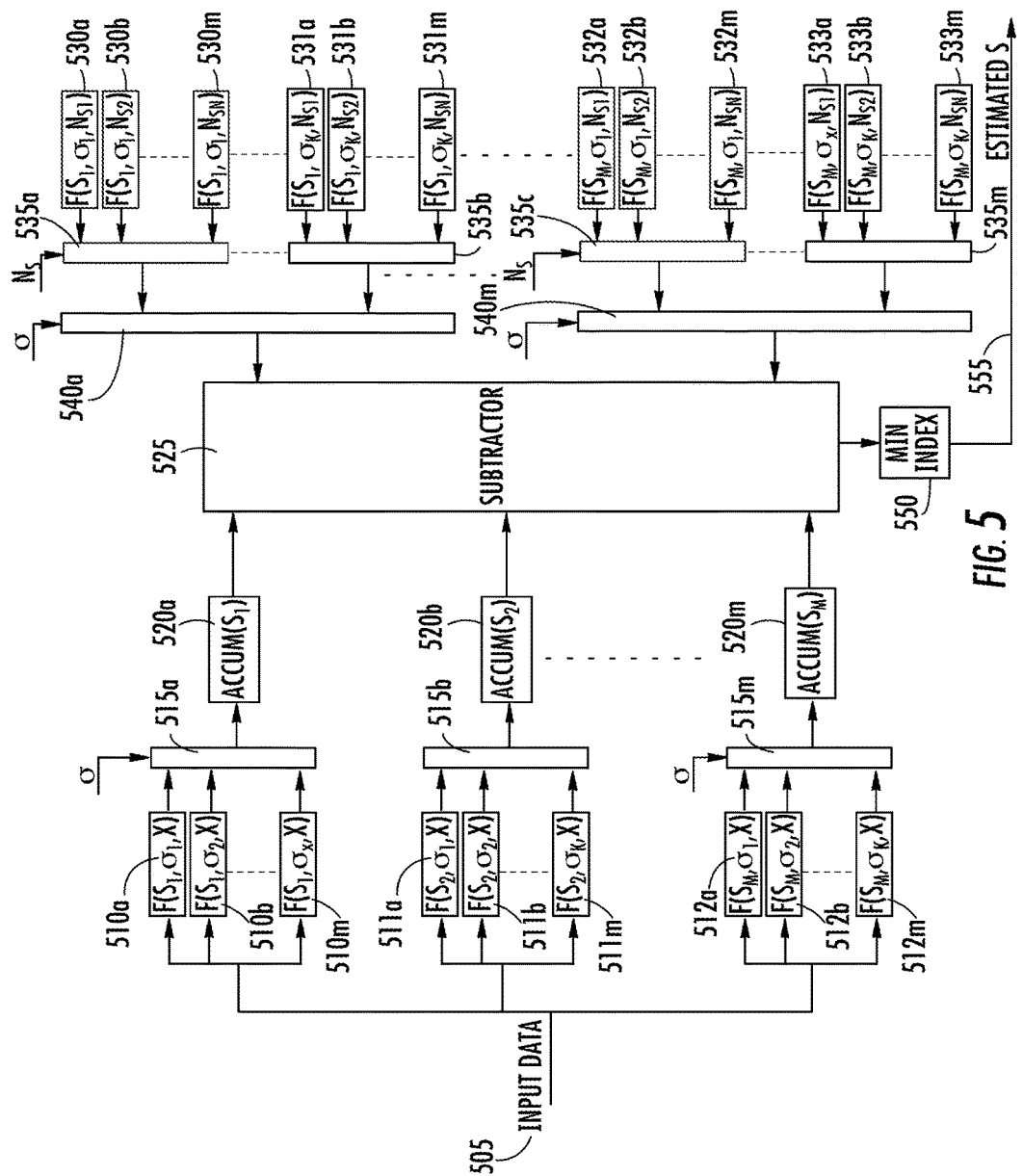
FIG. 5 is a block diagram of a demonstrative example of an MLE signal power estimator before timing.

FIG. 5 is a block diagram of a demonstrative example of the MLE signal power estimator before timing, i.e., before start-of-packet (SoP) detection in accordance with the method described with respect to FIG. 4. The demonstrative example is intended to solve Equation (7) for $S_{R,I}$.

Referring to FIG. 5 and starting with the LHS of Equation (7), $F_1$ is a function of $x_{R,I}(n)$, $S_{R,I}$, and $\sigma$. The values of $S_{R,I}$, and $\sigma$ may be fixed and $F_1$ may be made a function of $x_{R,I}(n)$ only, which is the input data 505. Assuming the value of $\sigma$ is known, the first set of multiplexers 515a, 515b, and 515m will select the set of $F_1$ functions, from LUTs 510a-m, 511a-m, 512a-m that correspond to the known a. Accumulators 520a-m will input various values of $S_{R,I}$ to subtractor 525. Referring to the right hand side (RHS) of Equation (7), $F_2$ is a function of $N_S$, $S_{R,I}$, and $\sigma$. The values of $N_S$ and $\sigma$ may be fixed and $F_2$ may be made a function of $S_{R,I}$ only. Once $N_S$ and $\sigma$ are known, the proper functions may be selected from LUTs 530a-m, 531a-m, 532a-m, 533a-m by multiplexers 535a-535m, 540a-540m that correspond to various values of $S_{R,I}$ for the fixed values of $N_S$ and $\sigma$. The RHS of Equation (7) for various values of $S_{R,I}$ are input at the right side of the subtractor 525. The subtractor 525 finds the value of $S_{R,I}$ that makes the LHS of Equation (7)=RHS of Equation (7). This is done by subtracting and finding the minimum $S_{R,I}$ index 550. This may be the correct value of $S_{R,I}$ 555, which is output.

Equation (6) may also be analyzed for the extreme case when $N_S=0$. With a finite number of observations this case may be likely, for example when the combined noise and signal amplitude are less than C. If $\{\sigma^2 \to 0\}$, it may be expected that the estimator yields to the mean of the absolute values of the samples. Letting $N_S=0$ in Equation (6), the third term may be zero and the estimate may be written as:

$$\hat{S}_{R,I} = \frac{1}{N_{NS}}\sum_{n=0}^{N_{NS}-1}\left(x_{R,I}(n)\tanh\left(\frac{S_{R,I}x_{R,I}(n)}{\sigma^2}\right)\right) \approx \quad \text{Equation (9)}$$

$$\frac{1}{N_{NS}}\sum_{i=0}^{N_{NS}-1}(|x_{R,I}(n)|),$$

where $$\lim_{\sigma^2 \to 0}\tanh\left[\frac{S_{R,I}x_{R,I}(n)}{\sigma^2}\right] = \text{sign}[x_{R,I}(n)]. \quad \text{Equation (10)}$$

The signal power ML estimator used after timing, i.e., after SoP detection, may be given in the form of a transcendental equation as $$\left[\frac{1}{N_{NS}}\sum_{n=0}^{N_{NS}-1}(x_{R,I}(n))\right] = \quad \text{Equation (11)}$$

$$S_{R,I} - \left[\left(\frac{N_{HS}}{N_{NS}}\sigma\sqrt{\frac{2}{\pi}}\right)\left(\frac{e^{-\left[\frac{(C-S_{R,I})^2}{2\sigma^2}\right]}}{\text{erfc}\left(\frac{C-S_{R,I}}{\sqrt{2}\sigma}\right)}\right) + \right.$$

$$\left.\left(\frac{N_{LS}}{N_{NS}}\sigma\sqrt{\frac{2}{\pi}}\right)\left(\frac{e^{-\left[\frac{(C+S_{R,I})^2}{2\sigma^2}\right]}}{\text{erfc}\left(\frac{C+S_{R,I}}{\sqrt{2}\sigma}\right)}\right)\right]$$

$$F_1(x_{R,I}(n)), = F_2(N_{HS}, N_{LS}, \sigma, S_{R,I})$$

Figure 6:
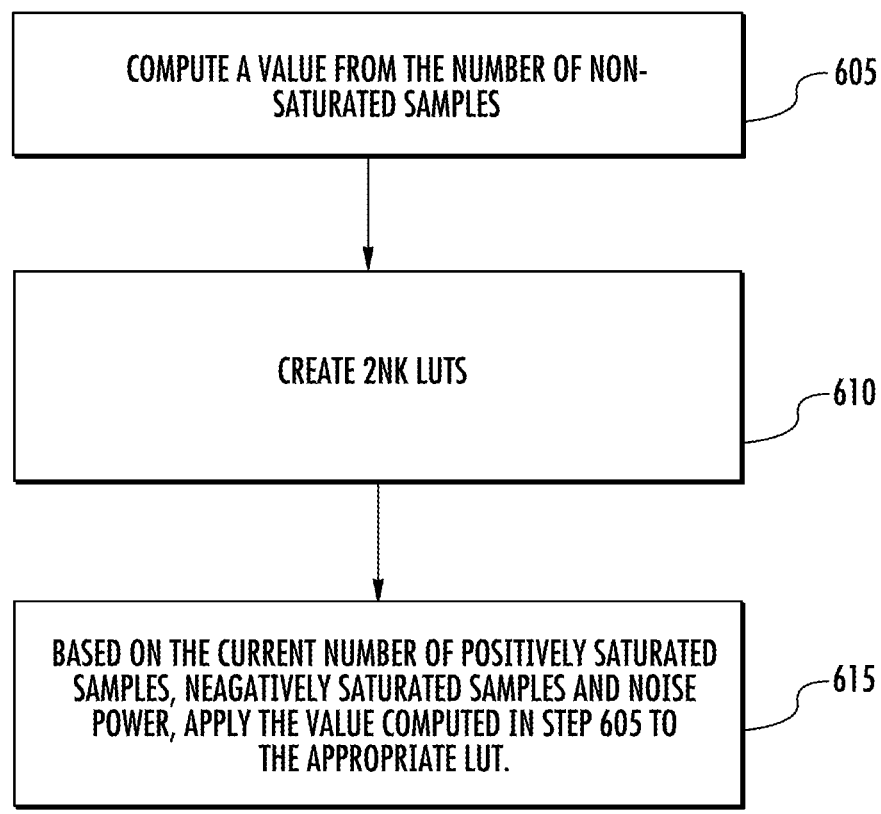
FIG. 6 is a flow diagram of an LUT-based signal power MLE method after timing.

FIG. 6 is a flow diagram of a LUT-based signal power MLE method after timing, in accordance with Equation (11). At step 605, a value, the LHS of Equation (11), is computed from $N_{NS}$ incoming samples, $$F_1(x_{R,I}(n)) = \frac{1}{N_{NS}} \sum_{n=0}^{N_{NS}-1} (x_{R,I}(n)).$$

At step 610 2NK LUTs are created, each representing the inverse of $F_2(N_{HS}, N_{LS}, \sigma, S_{R,I})$ for a particular value of $N_{HS}$, $N_{LS}$, and $\sigma$. At step 615, based on the current value of $N_{HS}$, $N_{LS}$, and $\sigma$, the value computed in step 605 is applied to the appropriate LUT.

Figure 7:
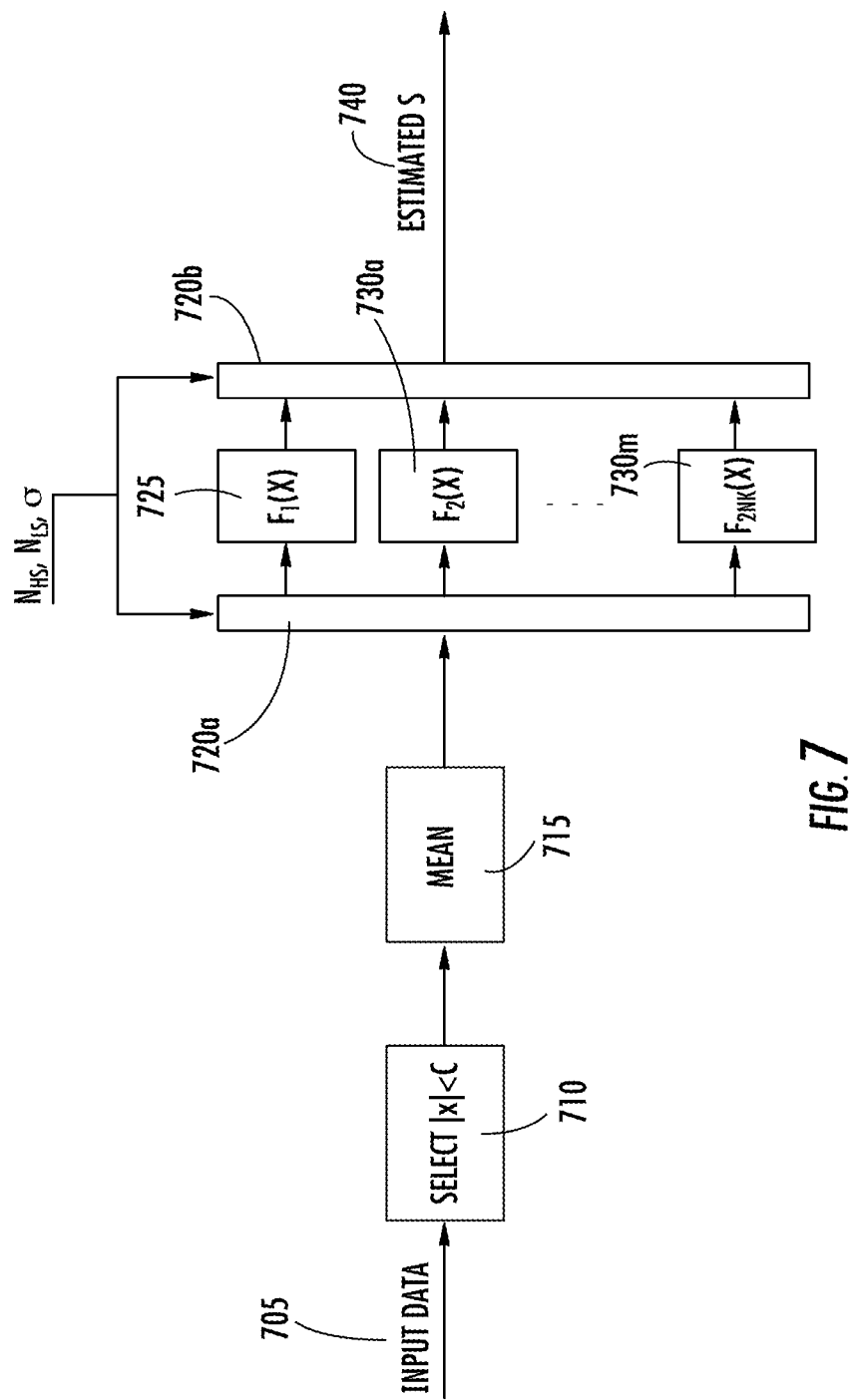
FIG. 7 is a block diagram of a demonstrative example of a LUT-based signal power MLE method after timing.

FIG. 7 is a block diagram of a demonstrative example of the ML signal power estimator after timing, i.e., after start-of-packet (SoP) detection, in accordance with the method described with respect to FIG. 6. The demonstrative example is intended to solve Equation (11) for $S_{R,I}$.

Referring to FIG. 7 and starting with the LHS of Equation (11), $F_1$ is a function of $x_{R,I}(n)$ only and may be directly solved from the input data 705. This is shown by the selector 710 and averager 715, resulting in $F_1(x)$ 725 in FIG. 7. This may be referred to as "Y." Referring to the RHS of the Equation (11), $F_2$ is a function of $N_{HS}$, $N_{LS}$, $\sigma$, and $S_{R,I}$. The values of $N_{HS}$, $N_{LS}$, and $\sigma$ may be fixed and $F_2$ may be made a function of $S_{R,I}$ only (i.e. $F_2(S_{R,I})$). Thus, Equation (11) may be expressed as $Y=F_2(S_{R,I})$ or $F_2^{-1}(Y)=S_{R,I}$. The inverse functions (one for each of the various values of $N_{HS}$, $N_{LS}$, and $\sigma$) are represented by LUTs 730a-730m between the two multiplexers 720a, 720b. Based on the values of $N_{HS}$, $N_{LS}$, and $\sigma$, the proper inverse function may be selected. The computed Y may be applied to this function to determine the desired value of $S_{R,I}$ 740.

Noise power estimation will now be described. Note that solving Equation (6) may require the noise power, $\sigma^2$, to be known. It may be estimated by following the same procedure and differentiate Equation (5) with respect to $\sigma$. Alternatively, the following method may be used.

The noise power may be estimated prior to the SoP where it may be assumed the packet signal is not present. The signal model for this case may be equivalent to Equation (2) with $s_{R,I}=0$, and may have a corresponding simplified PDF as follows:

$$p(x_{R,I}(n) \mid \sigma) = \begin{cases} \left(\frac{1}{2\pi\sigma^2}\right)^{\frac{1}{2}} \left(e^{-\left[\frac{(x_{R,I}(n))^2}{2\sigma^2}\right]}\right), & |x_{R,I}(n)| < C \\ \frac{1}{2}\mathrm{erfc}\left(\frac{C}{\sqrt{2}\,\sigma}\right), & |x_{R,I}(n)| = C \end{cases} \quad \text{Equation (12)}$$

The steps in Equation (4) to Equation (6) may then be followed to derive a similar MLE equation for the noise variance, $\widehat{\sigma^2}$, which may be written as:

$$\left[\frac{1}{N_{NS}} \sum_{n=0}^{N_{NS}-1} x_{R,I}^2(n)\right] - \sigma^2 + \quad \text{Equation (13)}$$

$$\left[\left(\frac{N_S \sigma C}{N_{NS}}\right) \sqrt{\frac{2}{\pi}} \left(\frac{e^{-\left[\frac{(C)^2}{2\sigma^2}\right]}}{\mathrm{erfc}\left(\frac{C}{\sqrt{2}\,\sigma}\right)}\right)\right] = 0.$$

Although this relationship is simpler than Equation (6), it is also transcendental and again an explicit relationship for $\sigma^2$ as a function of the remaining parameters may not be written. Similar to Equation (6), perception may also be gained into this equation by looking at an extreme case, the case where $N_S=0$ is likely, especially as $\sigma^2 \to 0$. In this case, it may be expected that the result is the classical expression for the variance obtained when deriving the variance of a non-saturated Gaussian pdf, which may indeed be true since the third term in Equation (11) goes to zero and the following is left:

$$\widehat{\sigma^2} = \frac{1}{N_{NS}} \sum_{n=0}^{N_{NS}-1} x_{R,I}^2(n) \quad \text{Equation (14)}$$

Figure 8:
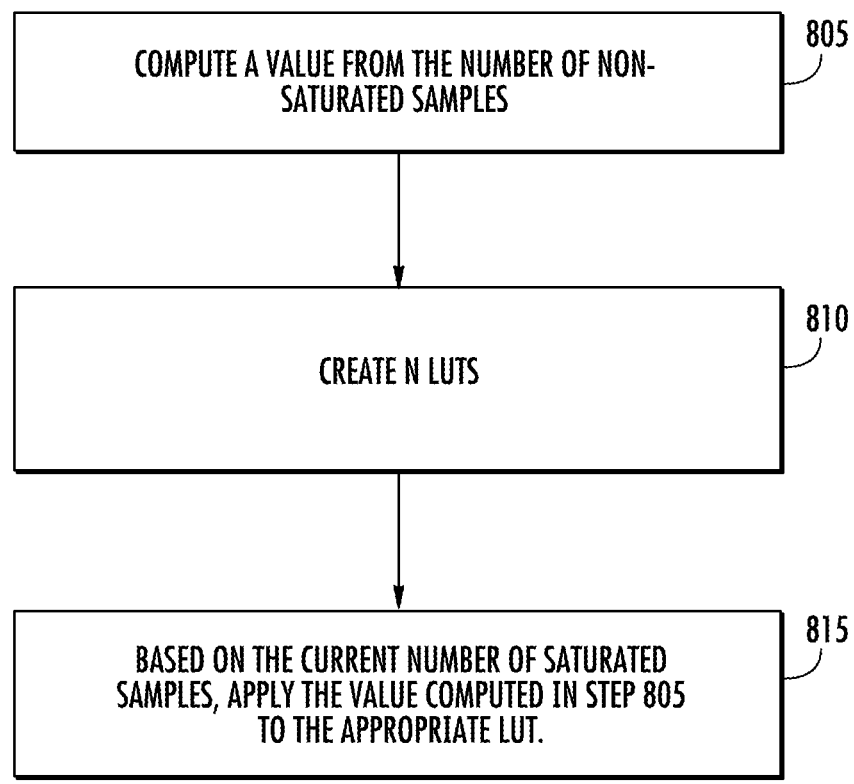
FIG. 8 is a flow diagram of an LUT-based noise power MLE method.

FIG. 8 is a flow diagram of a LUT-based noise power MLE method, in accordance with Equation (13). First, it should be noted that Equation (13) may be expressed as $$\left[\frac{1}{N_{NS}} \sum_{n=0}^{N_{NS}-1} [x_{R,I}(n)]^2\right] = \quad \text{Equation (15)}$$

$$\sigma^2 - \left[\left(\frac{N_S \sigma C}{N_{NS}}\right) \sqrt{\frac{2}{\pi}} \left(\frac{e^{-\left[\frac{(C)^2}{2\sigma^2}\right]}}{\mathrm{erfc}\left(\frac{C}{\sqrt{2}\,\sigma}\right)}\right)\right]$$

$$F_1(x_{R,I}(n)) = F_2(N_S, \sigma^2)$$

Referring to FIG. 8, at step 805, a value, the LHS of Equation (15), is computed from $N_{NS}$ incoming samples, $$F_1(x_{R,I}(n)) = \frac{1}{N_{NS}} \sum_{n=0}^{N_{NS}-1} [x_{R,I}(n)]^2.$$

At step 810, N LUTs may be created, each representing the inverse of $F_2(N_S, \sigma^2)$ for a particular value of $N_S$. At step 815, based on the current value of $N_S$, the value computed in step 805 is applied to the appropriate LUT, $\widehat{\sigma^2}=F_{2,N_S}^{-1}(F_1(x_{R,I}(n)))$.

Figure 9:
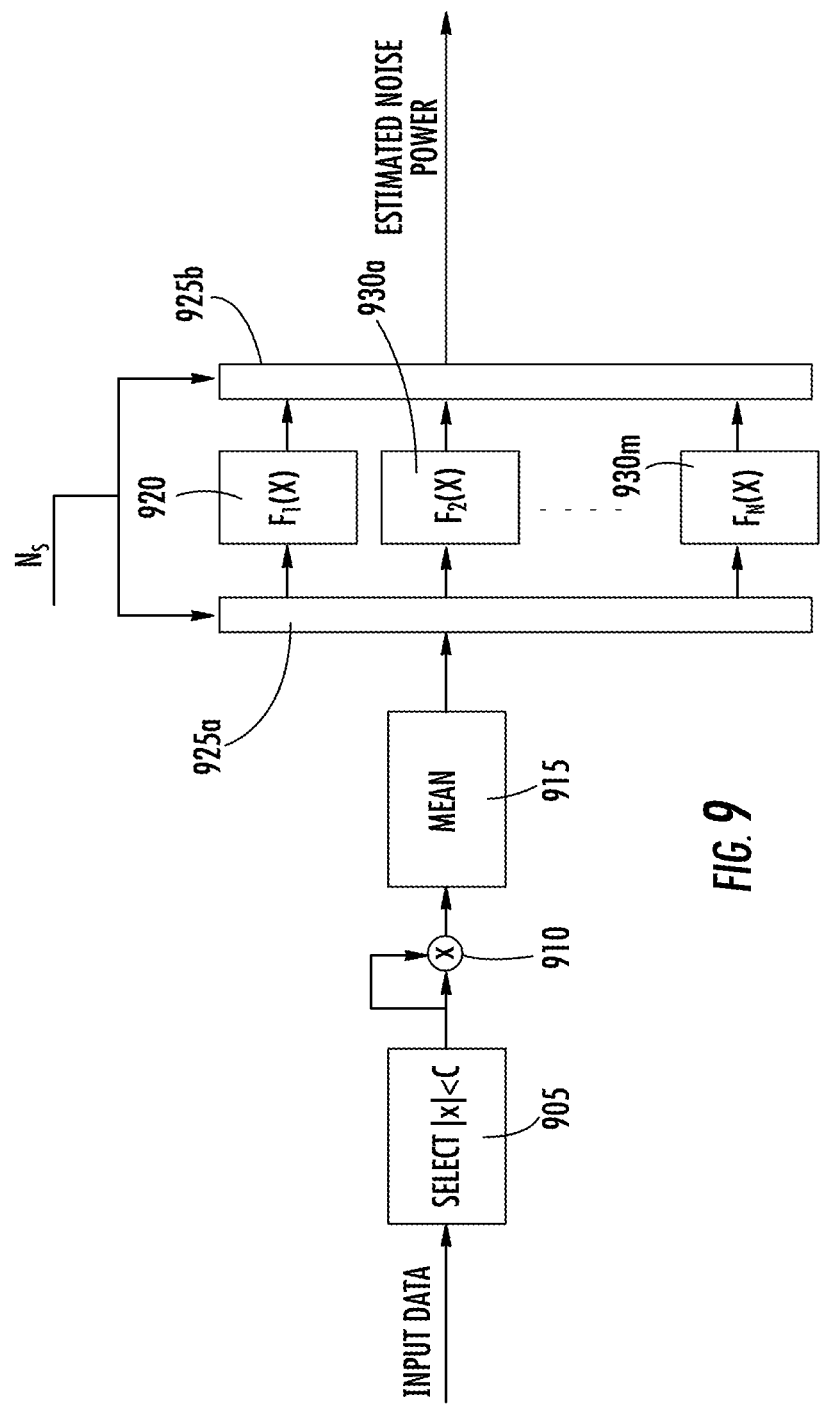
FIG. 9 is a block diagram of a demonstrative example of a MLE noise power method.

FIG. 9 is a block diagram of a demonstrative example of the MLE noise power method in accordance with the method described with respect to FIG. 8. The demonstrative example is intended to solve Equation (15) for $\sigma^2$. Referring to FIG. 9, the selector 905, mixer 910, and averager 915, compute a value for $F_1(x_{R,I}(n))$ 920, which may be referred to as "Y." The RHS of the Equation (15) is a function of $N_S$ and $\sigma^2$. N LUTs 930a-m are created between two multiplexers 925a 925b, each representing a function with a fixed $N_S$. Each function is also a function of $\sigma^2$ only. For each of these functions, $Y=F_2(\sigma^2)$. Assuming this "mapping" is one-to-one, the function may be represented as $\sigma^2=F_2^{-1}(Y)$. Since Y has been determined, $\sigma^2$ may be determined using the proper function that matches the known $N_S$.

The performance of the MLE estimators described above, as represented by Equations (6) and (11) will now be compared with a traditional total power estimator, based on the signal defined by Equation (2). The traditional total power estimate used in this comparison is the following classical estimator:

$$\hat{P}_{TR} = \left[\frac{1}{N}\sum_{n=0}^{N-1}[(x_R(n)^2) + (x_I(n))^2]\right].$$

Equation (16)

The operating ranges for the simulations are chosen to be approximately compatible with an IEEE 802.11ad system. TABLE 1 lists the main parameters:

TABLE 1

High Level Simulation Guideline Parameters

| Parameter | Value/Range |
|---|---|
| Thermal Noise @ 1.76 GHz | −81.5 dBm |
| Receiver Sensitivity | −78 dBm |
| Receiver Noise Figure | 5 dB |
| Interference | None or 10 dB |

The simulations may initialize the received signal power to the lowest value, −78 dBm, and increase the power until 100% saturated samples are likely. The noise power may be set based on the thermal noise, noise figure, and interference values shown in Table 1, above, where interference may be assumed additive white Gaussian noise (AWGN). Finally, the VGA gain may be set to maximum gain, 68 decibels (dB), which may be derived so that a noise only signal has a probability of saturation of 1% with a 5 dB receiver noise figure. A final simulation may be shown to illustrate the effect that the length of the signal, N, has on the power estimates.

Figure 10A:
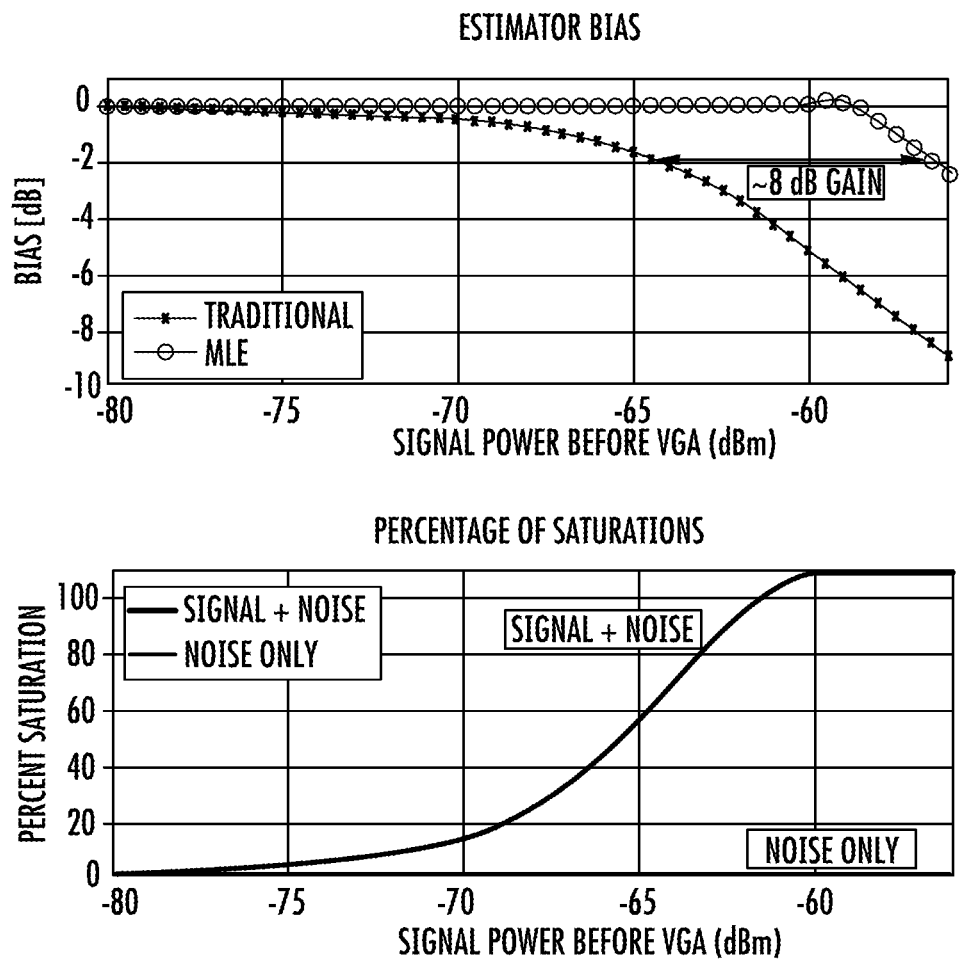
FIG. 10A is a performance simulation comparison between a traditional estimator and a MLE estimator with no interference.
Figure 10B:
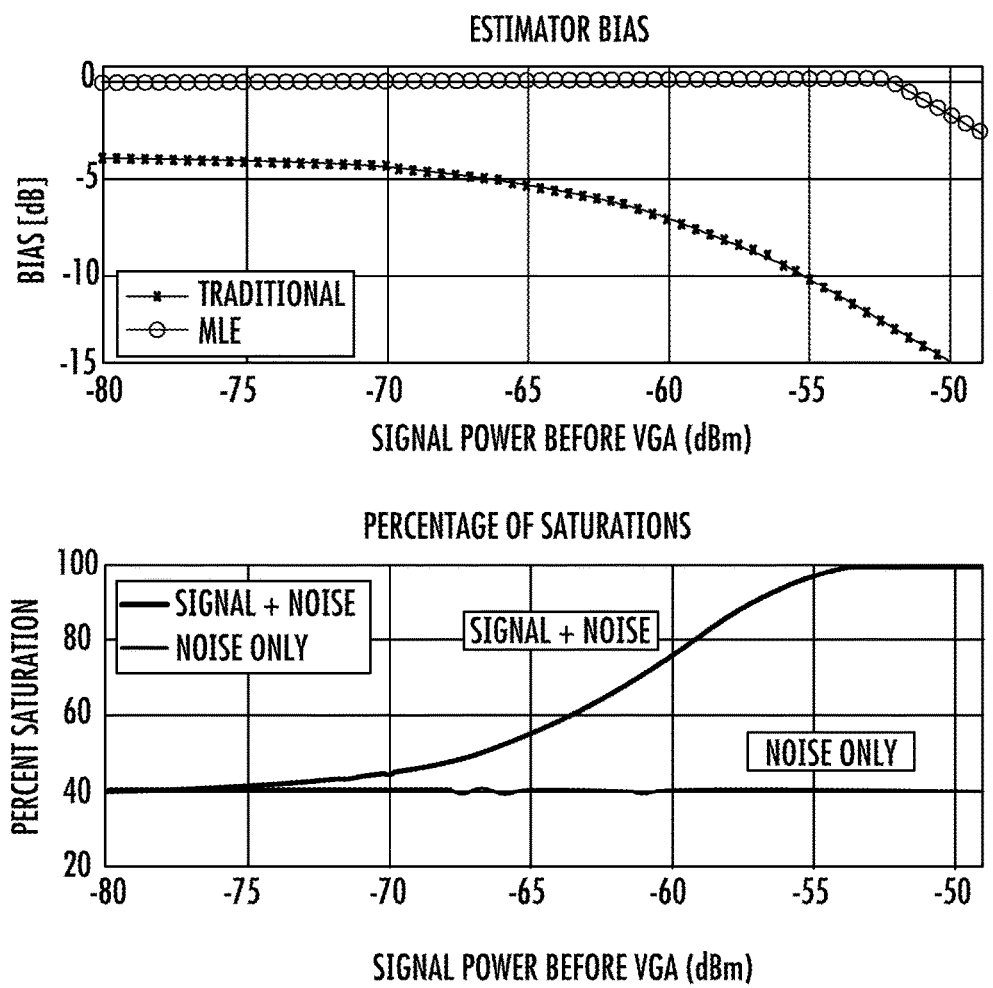
FIG. 10B is a performance simulation comparison between a traditional estimator and a MLE estimator with interference.

The results of the first set of simulations, with and without interference, are displayed in FIG. 10A, and FIG. 10B respectively. FIG. 10A is a performance simulation comparison between a traditional estimator and a MLE estimator with no interference. FIG. 10B is a performance simulation comparison between a traditional estimator and a MLE estimator with interference. Both simulations use N=512 and the performance statistic shown is the estimator bias averaged over 200 simulation iterations. In addition, the percentage of samples saturated as a reference is displayed in both FIGS. 10A and 10B. Assuming an acceptable bias value of less than 2 dB, FIG. 10A shows an additional 8 dB of operating range for the MLE estimator compared to the traditional estimator. With the addition of interference in FIG. 10B, the traditional estimator has greater than 4 dB of bias throughout the entire operating range, while the MLE power estimator grows to a 2 dB bias at approximately −50 dBm receive power. In this case, using the same 2 dB criteria as above, there is more than 30 dB of increased operating range using the MLE based estimator. Note in both cases the MLE based power estimator shows a less than 0.25 dB bias throughout the entire operating range until 100% saturation is reached. At this point the estimate becomes a constant value and the bias consequently increases at the same rate that the received power increases.

Figure 11:
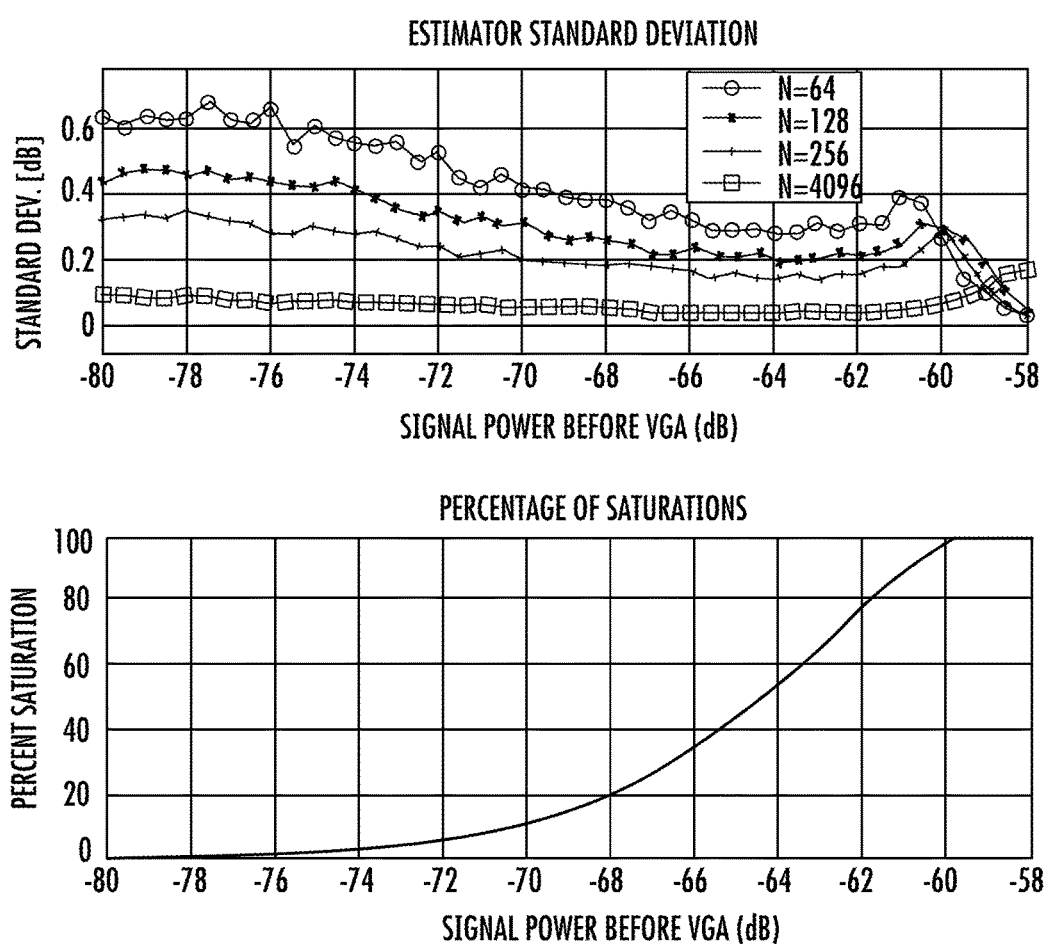
FIG. 11 is an MLE performance simulation comparison for varying signal lengths.

MLE variance comparison for varying signal length is also described herein. FIG. 11 is an MLE performance simulation comparison for varying signal lengths. The simulations of FIG. 11 use N values of 64, 128, 256, and 4096. For each of these lengths, the bias does not vary more than 1 dB over the operating range of the estimator. However, the variance grows as the number of samples decreases. As FIG. 11 shows, the standard deviation of the error is less than 1 dB, even for a signal length of 64 samples. This illustrates the robustness of the MLE technique for high speed applications (e.g., 64 samples in an IEEE 802.11ad waveform is ~36.5 nSec).

The second embodiment, generating two separate statistics to be used in conjunction with a look-up table (LUT) to estimate signal power and noise power, taking AIDC saturations into consideration, will now be described. First, a first statistic based on the samples in certain "bins," e.g., the samples that correspond to non-saturated sample "bins," is generated. The non-saturated samples may be used in this signal measurement procedure as required, while the saturated samples can either be used or not used at this point. Next, a second statistic based on the samples in certain other "bins," e.g., the samples that correspond to saturated sample "bins," is generated. The second statistic may be utilized to adjust the first statistic to more accurately represent the signal and noise power. In this way, a LUT, with B inputs, may be created to map the number of saturated samples from each "bin" to a bias value that may be added to the first statistic.

Figure 12:
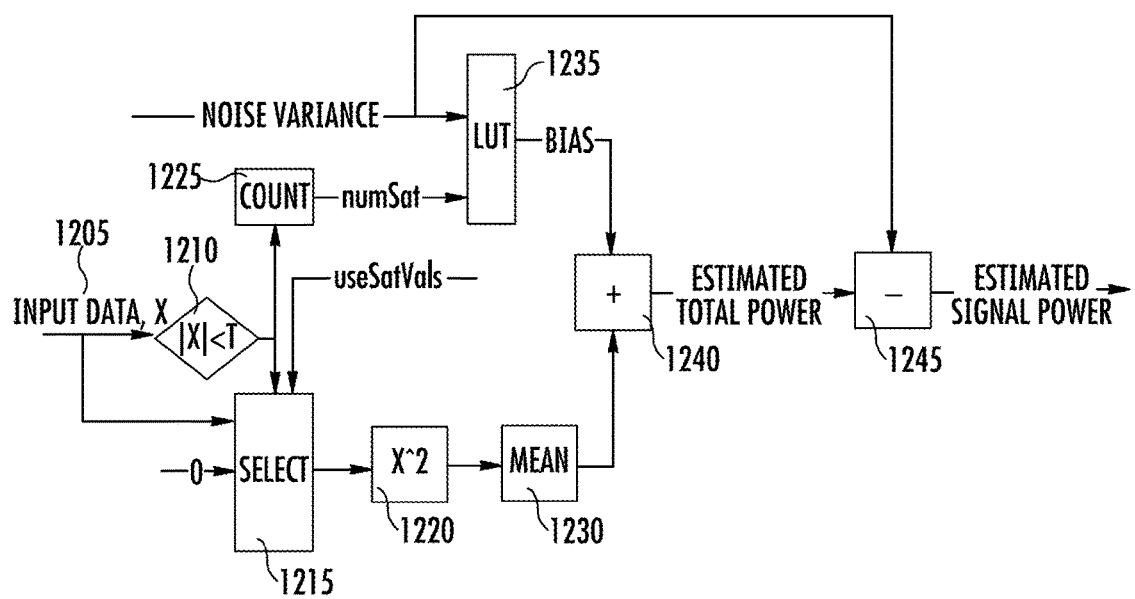
FIG. 12 is a block diagram of a demonstrative example of a LUT-based signal power estimator using multiple statistics.

FIG. 12 is a block diagram of a demonstrative example of a LUT-based signal power estimator using multiple statistics. The example described herein is for the case when B is two. Referring to FIG. 12, first, the traditional signal power is estimated using the following equation:

$$P = \frac{1}{K}\sum_{i=0}^{K-1}|x(i)|^2$$

Equation (17)

All samples in the summation (i.e., K=N) may be used. Alternatively, only samples below a threshold, T, in the summation may be used (i.e., K=$N_{NS}$). It should also be noted that |T| can be less than |C|. First, input data, x 1205 may be input into checker unit 1210 that checks if the input data, x 1205 is saturated. If the input data, x 1205 is determined to be saturated, the selector unit 1215 will force a "0" to the X^2 block 1220. If the input data, x 1205 is determined to not be saturated, the selector unit 1215 will allow the unsaturated input value to pass through to the X^2 block 1220. At the same time, a counter unit 1225 counts the number of samples, $N_S$ that are saturated, i.e., the number of samples that are greater than T or less than −T. Following the X^2 block 1220 is an averaging unit 1230. The averaging unit 1230 performs a simple average. This average may also be referred to as the traditional power estimate, P. This average may be taken on only the unsaturated values, so that a bias to this value may be applied to account for the saturated values. The bias may depend on the number of saturated samples and the noise variance, when available. In this way, the LUT 1235 may map the number of saturated samples, $N_S$, to a bias value that will be added to the traditional signal power estimate, P. For example, if there were no saturated samples, the bias value would be zero, thus nothing would be added. LUT 1235 may take on various forms (e.g. linear, quadratic, exponential), and may be based on empirical data for the system under consideration. Once noise power is estimated, using this procedure or the procedures described above, the noise variance may also be used as an input to the LUT 1235 for a more accurate bias estimate, when it is available. The noise variance may be used as an indication of the range of the saturated values. It should be noted that simply counting the saturations may provide limited information about their potential range before the AIDC. At adder unit 1240, the bias output of the LUT is added to the traditional power estimate, output from averaging unit 1230. The adder unit 1240 outputs an estimate of the total signal power. Assuming noise power is estimated prior to the packet arrival, it can be subtracted from the estimates performed during the packet to obtain signal power. At subtractor unit 1245, the noise power (noise variance) is substracted to derive an estimated signal power.

The third embodiment, a per-saturated sample adjustment method, will now be described. First, for each saturated sample, a new value that is greater than the saturated sample may be assigned. For example, if the input is assumed Gaussian, a new value may be pseudo-randomly assigned based on the Gaussian tail properties. This new value may now be used in the traditional signal measurement procedures, as described above.

In addition to improving the measurement technique, as described above, using more than one statistic may also improve AGC performance. Traditional techniques measure a single statistic (e.g. a power estimate) that is then used to compute a VGA gain. Using only a single value of the statistic does not generally provide a sufficient statistical description of the input signal to best set the VGA gain since a single value cannot completely describe the distribution of the signal. For example, even a simple Gaussian distribution requires two (2) numbers to describe its distribution, e.g. a mean and a variance. To address this concern the methods and apparatuses described herein may allow for a separate measurement of the noise only signal (or noise plus interference) that may be computed before the SoP. Following this, another measurement may be performed after the SoP. These two separate measurements may provide a more complete description of the signal and may subsequently allow for better VGA gain settings. These separate measurements may each use the general procedure above, but may typically generate different statistics. The measurements may be enabled by utilizing a control signal from a packet detection block in an AGC system.

Figure 13:
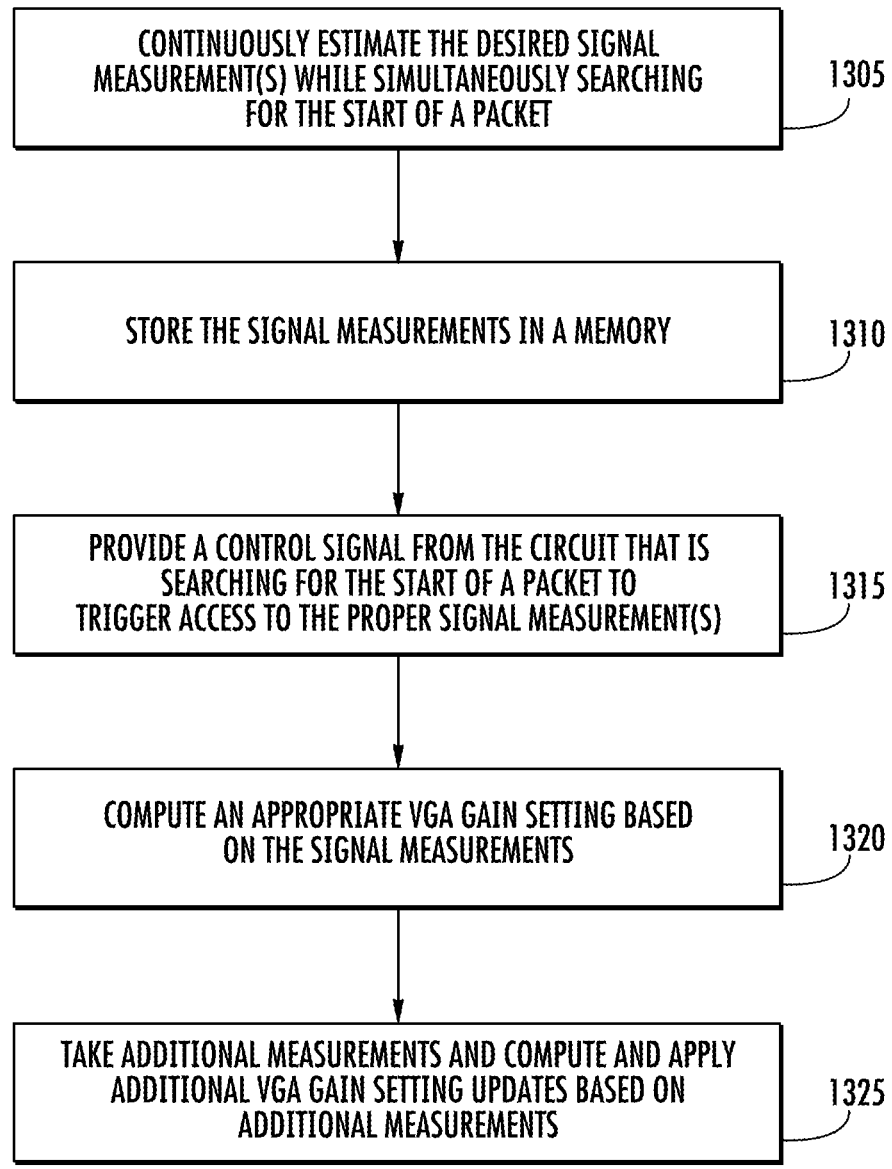
FIG. 13 is a flow diagram illustrating a method of utilizing multiple statistics to allow for better VGA gain settings.

A method of utilizing multiple statistics to allow for better VGA gain settings will now be described with reference to FIG. 13. FIG. 13 is a flow diagram illustrating a method of utilizing multiple statistics to allow for better VGA gain settings. Referring to FIG. 13, at step 1305, the receiver continuously estimates the desired signal measurement(s) while simultaneously searching for the SoP. The signal measurement may be based on a recent set of N consecutive samples, or be based on infinite impulse response (IIR) techniques with appropriate decay of memory. At step 1310, the signal measurements may be stored into a memory or data buffer. For example, a P element shift register, i.e., a first-in-first-out (FIFO) data buffer, may be used so that a recent set of P signal measurements are always available. At step 1315, a control signal may be provided from the circuit that is searching for the SoP in order to trigger access to the proper signal measurement(s). Generally two signal measurements may be accessed at this time, one that is based on samples before the start of the placket (i.e., preamble portion) and one based on samples after the start of the packet (i.e., data portion). It should be noted that these two desired signal measurements may be different, and the amount of delay required in order to access the proper signal measurement may be implementation specific. At step 1320, the signal measurements may be used to compute an appropriate VGA gain setting. One example criterion that may be used to set the VGA gain may be the desired probability of saturations, $P_S$ in the worst of the real and imaginary parts of the input data. It should be noted that since the noise and signal power estimates provide a sufficient statistic for the distribution, many criteria may be applied. An equation relating the desired percentage of saturations to the VGA gain may be expressed as follows:

$$P\{|x_{R,I}(n)| \geq C\} = \frac{1}{2}\left[\text{erfc}\left(\frac{C - \hat{S}_{R,I}}{\sqrt{2}\sigma}\right) + \text{erfc}\left(\frac{C + \hat{S}_{R,I}}{\sqrt{2}\sigma}\right)\right] = P_S.$$ Equation (18)

Equation 18 may be simplified, assuming that one of the complimentary error function terms is insignificant, removing it from the expression. A LUT may be used otherwise. Furthermore, assuming the initial VGA gain is known, the desired new VGA gain setting for each update, when updated in update i+1, may be determined using the following equation:

$$G_{i+1} = G_i \frac{C - \sqrt{2}\,\sigma\text{erfc}^{-1}(2P_S)}{\max\{\hat{S}_{R,i}, \hat{S}_{I,i}\}}$$ Equation (19)

At step 1325, additional measurements may be made and used to compute and apply additional VGA gain setting updates. Since coarse time alignment has now been obtained from packet detection, a different procedure for estimating a statistic (which may be the same statistic as used for a first VGA update) may be used. In addition, the timing that was obtained from packet detection may allow for a simpler and/or more accurate method to be used for estimating the signal statistic.

Figure 14:
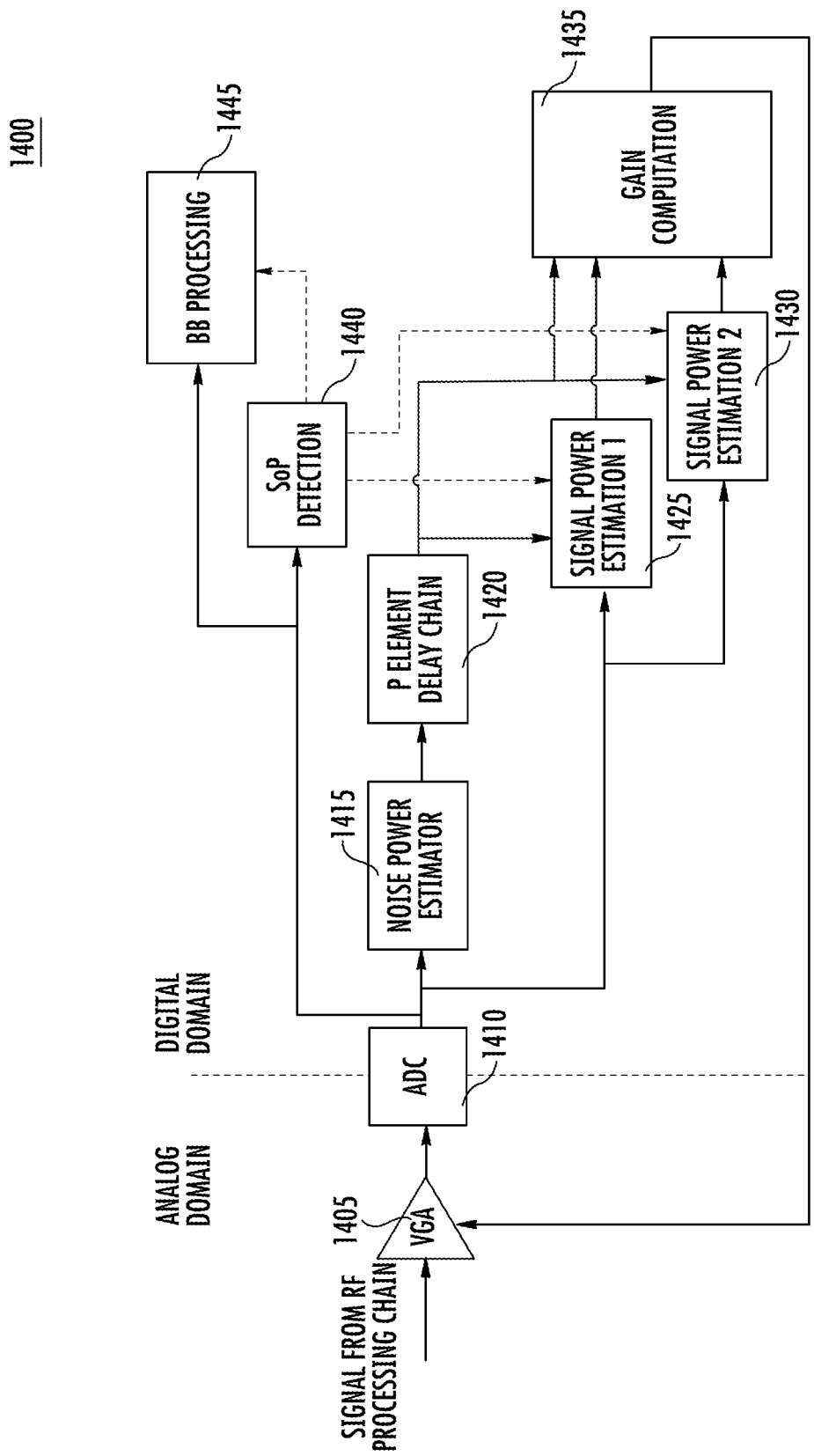
FIG. 14 is a diagram of an example fast AGC system capable of employing enhanced measurement and gain computation techniques.

FIG. 14 is a diagram of an example fast AGC system 1400 capable of employing the enhanced measurement and gain computation techniques described above. The example shown in FIG. 14 assumes an IEEE 802.11ad single carrier based system. In addition, the desired signal statistic is assumed to be a power measurement. Referring to FIG. 14, there is shown a VGA 1405, an ADC 1410, a noise power estimator 1415, a P-element delay chain 1420, a first signal power estimator 1425, a second signal power estimator 1430, a gain computation block 1435, a start of packet detection (SoP) block 1440, and a baseband processing block 1445.

The VGA 1405 is configured to scale an incoming analog signal from the radio front-end (RF) processing chain (not shown) based on feedback from the gain computation block 1435 in the digital domain. The ADC 1410 converts the analog signal to a digital signal. Signal values outside of the dynamic range of the ADC 1410, (i.e., +C, −C), may be clipped to these maximum and minimum values. The noise power estimator 1415 computes a non-traditional noise power estimate that takes potential saturations into account. The noise power estimator 1415 may use N data samples before the SoP. The P-element delay chain 1420, which functions as a delay chain for the various noise power estimates computed, ensures that the noise power estimate used is based on samples before the start of the packet. The first signal power estimator 1425 computes a non-traditional signal power estimate in the absence of timing information from the packet detection block 1440. The first signal power estimator 1425 may take potential saturations into account. The noise power estimate output from the noise power estimator 1415 may be used in the calculation of this signal power estimate. The signal power estimate from the first signal power estimator 1425 may be latched to the gain computation block 1435 as soon as the SoP detection block 1440 sends a control signal indicating the SoP has been detected. The second signal power estimator 1430 computes non-traditional power estimate(s) utilizing timing information from the SoP detection block 1440. The second signal power estimator 1430 may take into account potential saturations. The noise power estimate may also be used in the calculation of this signal power estimate. The gain computation block 1435 computes an appropriate gain value to be used for the current VGA update. The gain value may be a function of both the signal power and noise power estimates. The SoP detection block 1440 detects the SoP and sends a control signal to the first signal power estimator 1425 and the second signal power estimator 1430. The SoP detection block 1440 also sends timing control signals to the baseband processing block 1445. The AGC system described above may be used in a variety of configurations. The various configurations may depend on the particular implementation as well as receiver design requirements. Each configuration may result in a different processing timeline.

As discussed above, an IEEE 802.11ad system is an example system that may be used in combination with the methods and apparatus disclosed herein. The IEEE 802.11ad single carrier preamble format consists of a string of concatenated Golay (GA) sequences. Additionally, for illustrative purposes, an IEEE 802.11ad receiver may have the following assumed requirements: (1) the SoP is declared based on four (4) consecutive GA sequences; (2) the power estimates use N samples, where N is the length of one GA sequence; and (3) one GA sequence is taken as the time for the VGA to settle from a gain update.

Figure 15:
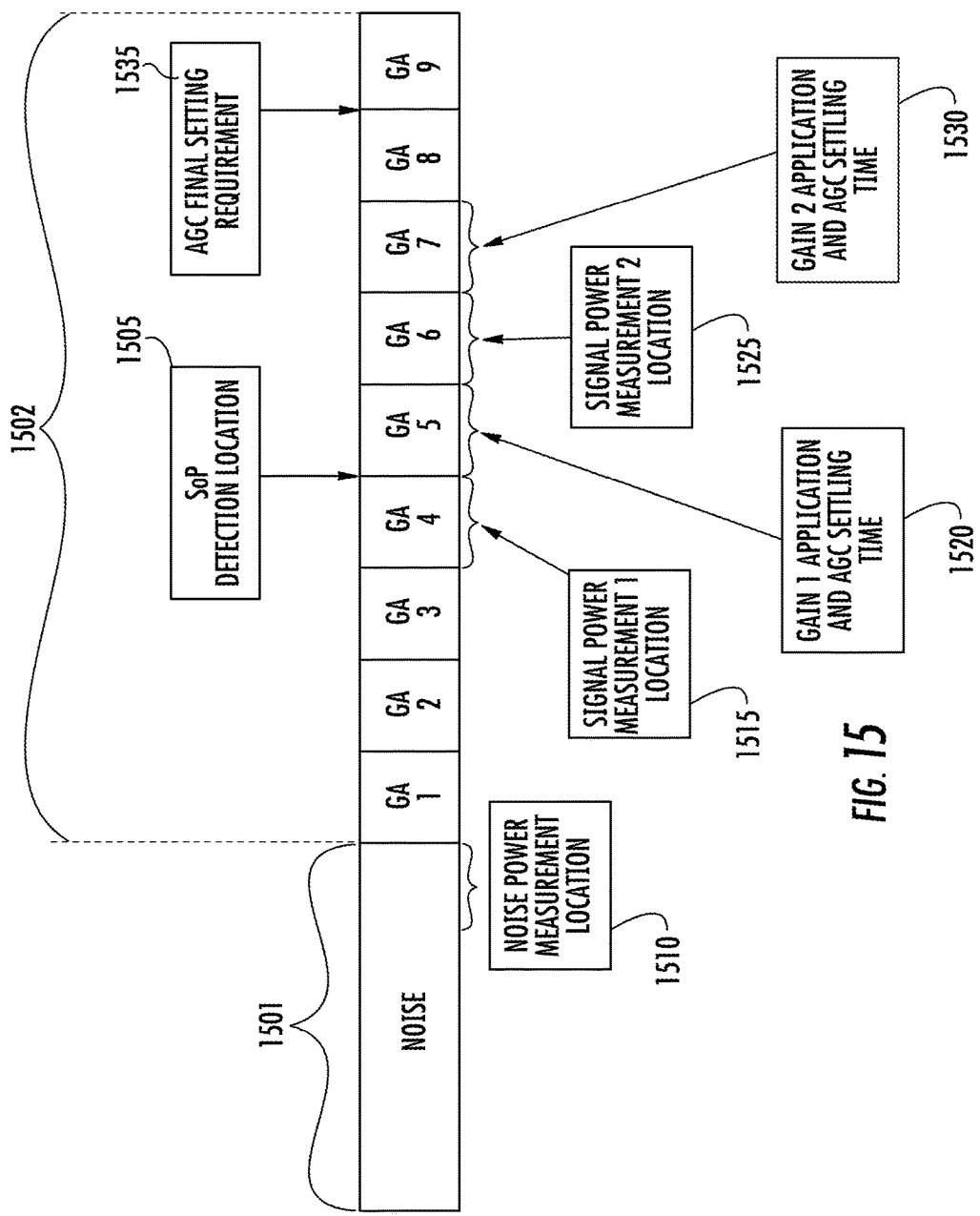
FIG. 15 is a diagram of an example fast AGC timeline illustrated with an IEEE 802.11ad single carrier preamble format.

FIG. 15 is a diagram of an example fast AGC timeline illustrated with an IEEE 802.11ad single carrier preamble format in accordance with the fast AGC example system described above with respect to FIG. 13. As shown in FIG. 15, the example preamble format consists of a string of nine (9) GA sequences 1502, preceded by a noise segment 1501. At start-up, three functions operate simultaneously: (1) start of packet detection, which searches for four (4) consecutive GA sequences, which occurs at the end of the $4^{th}$ GA sequence 1505; (2) noise power estimation, which occurs at the end portion 1510 of noise segment 1501, which computes consecutive N-sample noise power estimates and outputs to the P-element delay chain, in this example P≥4; and (3) a first signal power estimation which occurs at the $4^{th}$ GA sequence 1515, which computes consecutive N-sample signal power estimates, each time using the noise estimate from output of the P-element delay chain. A packet is nominally detected at the end of GA4 1505. As a result, a control signal may be sent to the first signal power estimator. Based on the control signal from the SoP detection, the current signal power is measured at the $4^{th}$ GA sequence 1515. This current signal power measurement and noise power estimate measured at the end portion 1510 of noise segment 1501 are output to a gain computation block. A gain value is computed and fed back to the VGA at this time. One GA time, occurring at the $5^{th}$ GA sequence 1520, is allowed for the VGA to settle. After the VGA settling time, the second signal power estimation occurs at the $6^{th}$ GA sequence 1525. The second signal power estimation computes a new signal power estimate based on N samples and outputs this to the gain computation block. A second gain value is computed and fed back to the VGA. One GA time is allowed for the VGA to settle, which occurs at the $7^{th}$ GA sequence 1530. The estimator stops and the VGA is allowed to fully stabilize between the $8^{th}$ and $9^{th}$ GA sequence 1535, prior to further processing of the preamble and data portion of the packet.

Power sequencing methods will now be described. The power sequencing methods described herein may be used separately or in conjunction with the methods and techniques described above.

Figure 16:
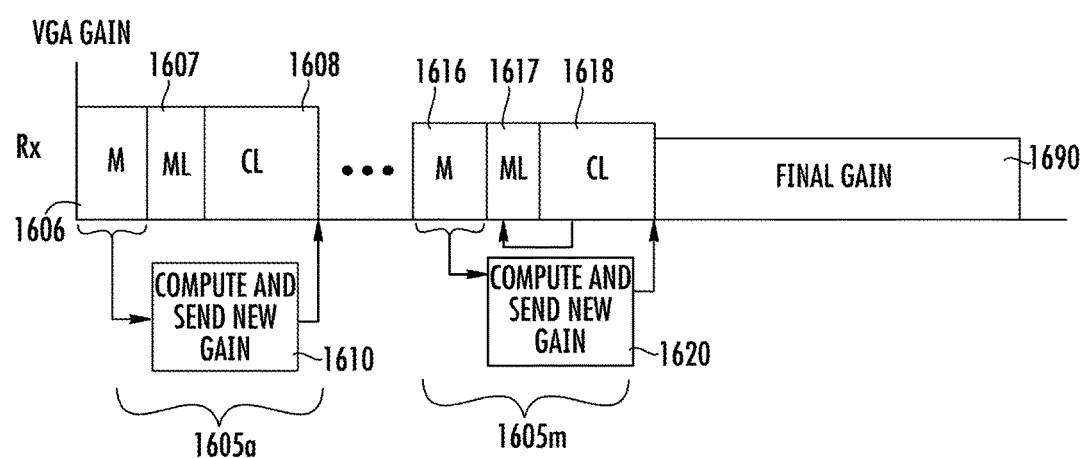
FIG. 16 is a diagram illustrating the receiver side actions during a traditional gain convergence procedure.

As described above, gain convergence is traditionally an iterative process. FIG. 16 is a diagram illustrating the receiver side actions during a traditional gain convergence procedure. Referring to FIG. 16, at the receiver, multiple iterative gain computations 1605a, . . . , 1605m may be needed in order to converge on a final gain 1690. For example, a first gain update 1610 in the first iterative gain computation 1605a includes a measured data time, M 1606, a measurement latency period, ML 1607, and a control latency period, CL 1608. Multiple iterations may occur, each including a measured data time, a measured latency period, and a control latency period. It is not until a final gain computation iteration 1605m is conducted, consisting of yet another measured data time, M 1616, a measurement latency period, ML 1617, and a control latency period, CL 1618, does the system conduct a final gain update 1620 to arrive at the final gain 1690. These time periods significantly slow down AGC convergence. Thus, there is a need to reduce the time period required for AGC convergence.

In a first embodiment, a sequence may be prepended to the preamble of a transmitted packet. This sequence includes multiple power levels (e.g., a ramp or staircase power profile, an alternating power level profile, or any arbitrary order of power level profile) transmitted at or near the beginning of the preamble. These power levels may be predefined, and known a priori at the receiver. The receiver may compute statistics for this sequence, i.e, based on each sequence of each different, pre-defined power level. The receiver may then compute an appropriate VGA gain based on the computed statistics, eliminating the need for multiple iterations and gain updates, as traditionally required.

Figure 17:
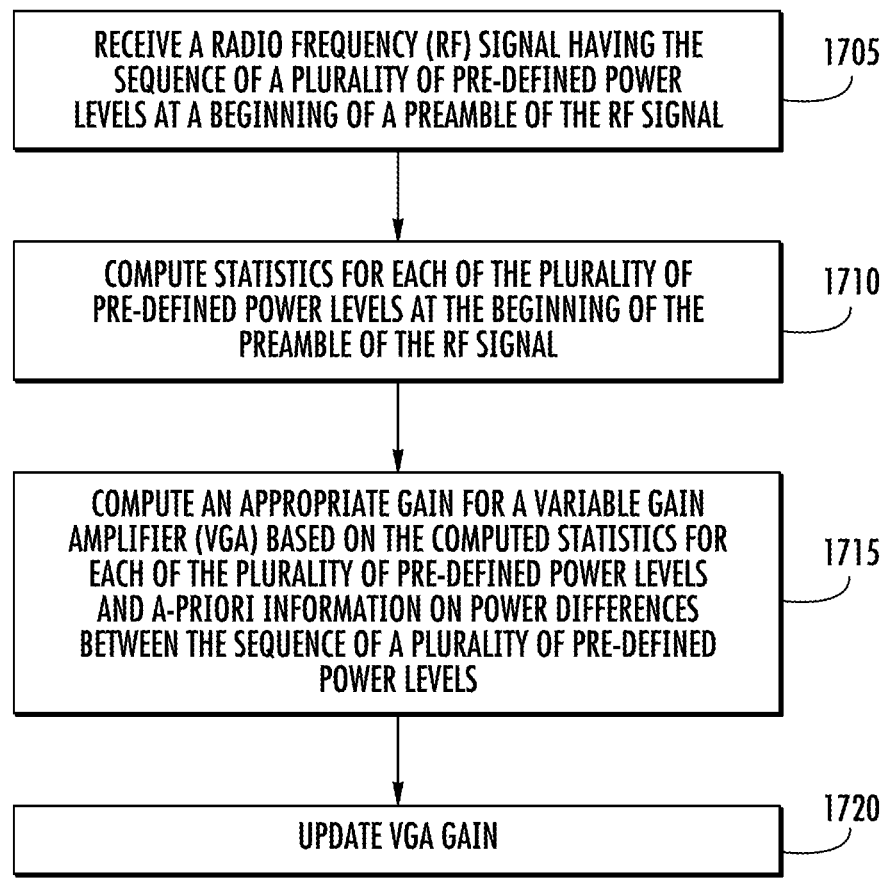
FIG. 17 is a flow diagram of an example signal power sequencing method in accordance with a first embodiment.

FIG. 17 is a flow diagram of an example signal power sequencing method in accordance with the first embodiment described above. Referring to FIG. 17, at step 1705, a radio frequency (RF) signal is received. The RF signal includes a sequence of a plurality of pre-defined power levels at a beginning of a preamble of the RF signal. At step 1710, statistics for each of the plurality of pre-defined power levels at the beginning of the preamble of the RF signal are computed. At step 1715, an appropriate gain for a VGA is computed. The VGA gain may be based on the computed statistics for each of the plurality of pre-defined power levels and a-priori information on power differences between the sequence of a plurality of pre-defined power levels. At step 1720, the VGA gain is updated.

Figure 18:
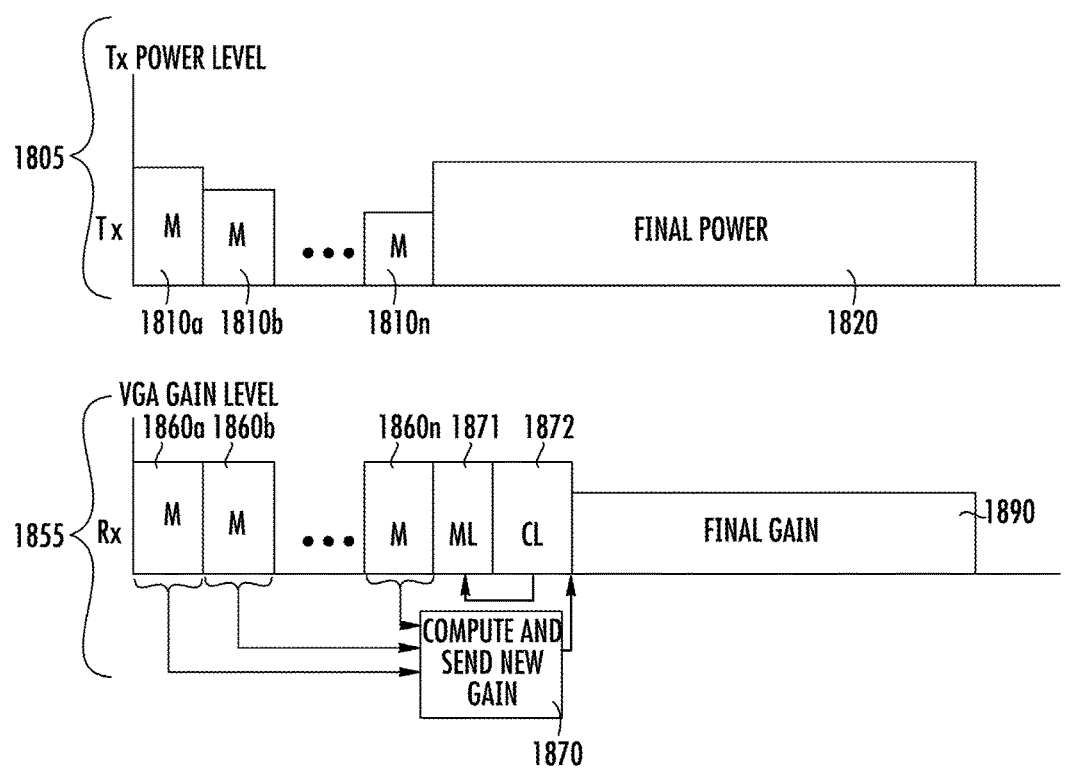
FIG. 18 is a diagram illustrating the relationship between the transmitter and receiver side actions in the signal power sequencing method of FIG. 16.

FIG. 18 is a diagram illustrating the relationship between the transmitter and receiver side actions in accordance with the method described with respect to FIG. 17. Referring to FIG. 18, the power level at the transmitter side 1805 and the VGA gain level at the receiver side 1855 are shown. It should be noted that the multiple power levels at the transmitter side 1805 may take many forms. For example, they may be ascending or descending ramps of amplitude or power. Alternatively, they may be alternating levels of amplitude or power in no specific arrangement. At the transmitter side 1805, a sequence with multiple power levels 1810a-n, is transmitted at or near the beginning of the preamble, before the final power level 1820 is used. For illustration purposes, the sequence with multiple power levels 1810a-n is depicted as a descending ramp of amplitude or power. At the receiver side 1855, the VGA gain may be initially set to the highest useful gain setting, e.g., high enough for the background noise to be measured, but very rarely causing ADC saturation. The receiver measures and computes statistics for each part of the received sequence 1860a-n, with multiple power levels 1810a-n. The receiver computes a new gain and makes a single gain update 1870 to arrive at a final gain 1890. This single gain update 1870 includes the measured data times associated with each part of the received sequence 1860a-n, however it only includes a single measurement latency period, ML 1871, and a single control latency period, CL 1872. By eliminating the multiple iterations, and related multiple measurement and control latency periods, AGC convergence is achieved much faster than in the traditional methods.

In addition, the AIDC outputs (either on per I-Q basis or according to a function of both I and Q ADC output pairs) may be compared to a threshold to generate a binary sequence, e.g., '1's and '0's. For example, if the ADC output is above the threshold a '1' would be generated. If the ADC output is below the threshold, a '0' would be generated. A power ramp threshold crossing algorithm (running in parallel to the SoP detection) may be used to estimate the fraction of samples that were above the threshold in the last set of recent samples (e.g. the number of samples in the sequence).

The power ramp threshold crossing algorithm may be triggered by SoP detection or may be self-triggered. When SoP triggered, outputs of the threshold crossing algorithm may be continuously pushed into a buffer for later reading when the packet timing is learned. When the SoP is triggered, the timing may be known and the estimate of the fraction of samples above the threshold may be extracted from the buffer. The estimated fraction of samples above the threshold may be used to estimate a next VGA gain setting. A larger fraction of samples above the threshold indicates a lower gain should be used. This may be implemented via a LUT. While visualized as a ramp, any ordering of a distribution of Tx samples may be used.

When self-triggered, at the point in time when the input signal causes a large number of saturations (and thus a traditional AGC would need the most time to converge), a rapid self-detection may be used rather than the SoP detection. For a descending ramp, an example of a rapid self-detection may be simply a K-input AND gate, where the K inputs are the last K elements of the binary sequence produced by the ADC output threshold comparisons. For example, the K-input AND gate outputs a '1' as long as all values that are input are set to '1'; otherwise the output would be '0'. For example, the mapping for a two input AND gate is:

in1=0, in2=0: out=0
in1=0, in2=1: out=0
in1=1, in2=0: out=0
in1=1, in2=1: out=1.

After approximately N-K samples from the rapid self-detection, the average of the last ~N samples of the binary sequence may be used to update the VGA gain.

Figure 19:
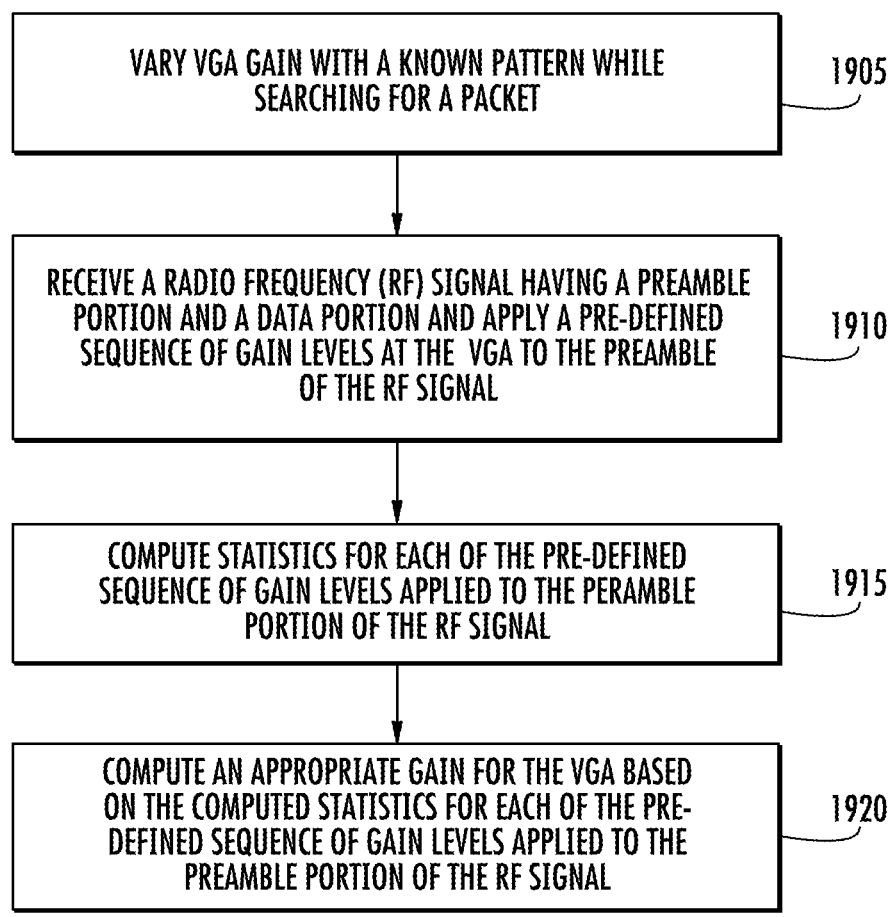
FIG. 19 is a flow diagram of an example signal power sequencing method in accordance with a second embodiment.

In a second embodiment, the receiver gain is varied over a specific range while ADC measurements are being made during reception of the beginning of a preamble. A comparison between the known receiver gain and the probability of the ADC output threshold crossing may be made to estimate a first VGA gain setting. FIG. 19 is a flow diagram of an example signal power sequencing method in accordance with the second embodiment described above. Referring to FIG. 19, at step 1905, while the receiver is searching for a packet, the receiver varies its VGA gain with a known pattern. SoP detection runs in parallel, but is largely unaffected by the varying gain since only the sign of the signal is required for SoP processing. At step 1910, an RF signal is received. The RF signal includes a preamble portion and a data portion. The receiver applies a pre-defined sequence of gain levels at a VGA to the preamble portion of the RF signal. At step 1915, statistics for each of the pre-defined sequence of gain levels applied to the preamble portion of the RF signal are computed. These statistics of the signal at the ADC output (e.g., percentage over a threshold) may be pushed to a buffer. At step 1920, an appropriate gain for the VGA is computed based on the computed statistics for each of the pre-defined sequence of gain levels applied to the preamble portion of the RF signal. This may occur when the SoP is triggered. In that case, the statistic(s) in the buffer are used to set the first VGA gain update.

Figure 20:
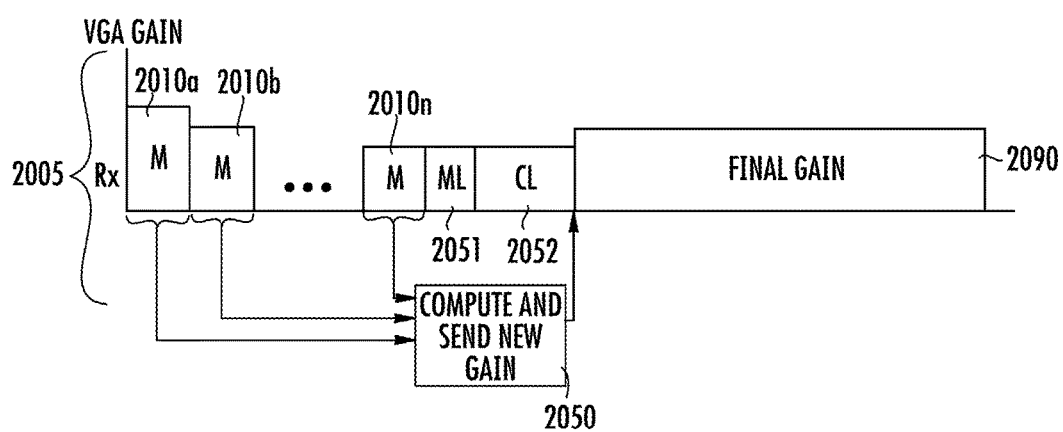
FIG. 20 is a diagram illustrating the relationship between the transmitter and receiver side actions in the signal power sequencing method of FIG. 18.

FIG. 20 is a diagram illustrating the receiver side actions in accordance with the method described with respect to FIG. 19. Referring to FIG. 20, the VGA gain level at the receiver side 2005 is shown. A pre-defined sequence of VGA gains 2010a-n are applied and statistics are computed at the beginning of the received preamble of a packet, each occurring during a measured data time, M. Once a packet is detected, an appropriate first VGA gain is computed 2050. The first VGA gain computation 2050 includes a single measurement latency period, ML 2051, and a control latency period, CL 2052 before the final gain 2090 is converged on.

Re-computing per-link VGA gain settings are described herein. In many cases, the receiver may be required to support only a finite and predictable number of links to other nodes. Assuming these nodes are static (e.g., mesh backhaul links); the per-link VGA gain setting should not substantially change over time. In other words, after the first time the link is used, and an appropriate VGA gain setting is found, the VGA gain setting should remain relatively constant over time as the link is utilized. Current AGC systems start the AGC control loop with the VGA set to its initial high gain, each time the link is accessed. Thus, it is desirable to retain previous measurements to reduce AGC convergence times on all link accesses following an initial access. Solutions described below may address various problems identified above including but not limited to reducing AGC convergence times on all link accesses following the initial access.

After every time a link is used, the receiver may take note of the VGA setting used and save it in a memory indexed by the link ID. When the receiver is listening for a packet in a direction consistent with a particular link or links, the last used VGA setting(s) may be extracted from the memory using the corresponding link ID(s) as index. The direction of a link may be defined as a beam suitable for receiving a transmission on that link. The extracted VGA setting(s) may be used to adjust the gain of the VGA. Such adjustments may be different before and after the SoP detection, e.g. the VGA gain may be set higher before SoP so that a better noise estimate may be made and a good SoP detection may occur. After the SoP detection, the extracted VGA setting(s) may have greater influence on the initial VGA setting. In the event that the received signal is a scheduled transmission, the link ID may not need to be inferred from the beam direction and the previous VGA gain may be accessed directly with the known link ID.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method for use in a packet-based wireless communication system for reducing automatic gain control (AGC) convergence time at a receiver, the method comprising:
   receiving a radio frequency (RF) signal including a preamble portion and a data portion;
   applying a pre-defined sequence of gain levels at a variable gain amplifier (VGA) to the preamble portion of the RF signal;
   computing statistics when each of the pre-defined sequence of gain levels is applied to the preamble portion of the RF signal; and
   computing an appropriate gain for the VGA based on the computed statistics when each of the pre-defined sequence of gain levels is applied to the preamble portion of the RF signal.

2. The method of claim 1, further comprising:
   updating a gain of the VGA based on the computed appropriate gain to receive the data portion of the RF signal.

3. The method of claim 1, wherein the packet based wireless communication system is an IEEE 802.11ad packet-based system.

4. The method of claim 1, further comprising:
   storing, in a buffer, the computed statistics when each of the pre-defined sequence of gain levels is applied to the preamble portion of the received RF signal, until a start-of-packet (SoP) is detected.

5. The method of claim 4, wherein computing the appropriate gain for the VGA is performed when the SoP is detected.

6. The method of claim 1, further comprising:
   storing the computed appropriate gain for the VGA in a memory, wherein the stored computed appropriate gain is indexed by a corresponding link identifier.

7. The method of claim 6, further comprising:
   extracting a previously computed appropriate gain for the VGA from the memory based on the corresponding link identifier; and
   updating a gain of the VGA based on the extracted previously computed appropriate gain.

8. A wireless transmit/receive unit (WTRU) configured to operate in a packet-based wireless communication system by reducing automatic gain control (AGC) convergence time at a receiver in the WTRU, the WTRU comprising:
   the receiver coupled to a baseband processor, a transmitter and an antenna;
   the receiver configured to receive a radio frequency (RF) signal including a preamble portion and a data portion;
   the receiver configured to apply a pre-defined sequence of gain levels at a variable gain amplifier (VGA) to the preamble portion of the RF signal;
   the receiver configured to compute statistics when each of the pre-defined sequence of gain levels is applied to the preamble portion of the RF signal; and
   the receiver configured to compute an appropriate gain for the VGA based on the computed statistics when each of the pre-defined sequence of gain levels is applied to the preamble portion of the RF signal.

9. The WTRU of claim 8, wherein:
   the receiver is configured to update a gain of the VGA based on the computed appropriate gain to receive the data portion of the RF signal.

10. The WTRU of claim 8, wherein the packet based wireless communication system is an IEEE 802.11ad packet-based system.

11. The WTRU of claim 8, wherein:
   the receiver is further configured to store, in a buffer, the computed statistics when each of the pre-defined sequence of gain levels is applied to the preamble portion of the received RF signal, until a start-of-packet (SoP) is detected.

12. The WTRU of claim 11, wherein:
   the receiver is configured to compute the appropriate gain for the VGA is performed when the SoP is detected.

13. The WTRU of claim 8, wherein:
   the receiver is further configured to store the computed appropriate gain for the VGA in a memory, wherein the stored computed appropriate gain for the VGA is indexed by a corresponding link identifier.

14. The WTRU of claim 13, wherein:
   the receiver is configured to extract a previously computed appropriate gain for the VGA from the memory based on the corresponding link identifier; and
   the receiver is configured to update a gain of the VGA based on the extracted previously computed appropriate gain.

15. A method for use in a packet-based wireless communication system for reducing automatic gain control (AGC) convergence time at a receiver, the method comprising:
   receiving a packet in a wireless radio frequency (RF) signal, wherein the packet includes a preamble portion and a data portion;
   applying a pre-defined sequence of gain levels at a variable gain amplifier (VGA) to the preamble portion;
   computing statistics when each of the pre-defined sequence of gain levels is applied to the preamble portion of the RF signal, wherein the statistics correspond to one or more of a signal power, a signal amplitude, a signal root mean square (RMS) value, and a peak-to-peak signal amplitude;
   computing an appropriate gain for the VGA based on the computed statistics when each of the pre-defined sequence of gain levels is applied to the preamble portion of the RF signal; and
   amplifying, by the VGA, the data portion of the packet, based on the computed appropriate gain.

16. The method of claim 15, wherein the packet based wireless communication system is a cellular based wireless communication system.

17. The method of claim 15, wherein the packet is received from a base station.

* * * * *